(12) United States Patent
Tang et al.

(10) Patent No.: US 11,024,735 B2
(45) Date of Patent: Jun. 1, 2021

(54) METHODS OF FORMING INTEGRATED CIRCUITRY

(71) Applicant: Micron Technology, Inc., Boise, ID (US)

(72) Inventors: Sanh D. Tang, Kuna, ID (US); Hong Li, Boise, ID (US); Erica L. Poelstra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 16/596,423

(22) Filed: Oct. 8, 2019

(65) Prior Publication Data
US 2020/0052113 A1 Feb. 13, 2020

Related U.S. Application Data

(62) Division of application No. 15/976,720, filed on May 10, 2018, now Pat. No. 10,461,185.
(Continued)

(51) Int. Cl.
*H01L 21/336* (2006.01)
*H01L 29/78* (2006.01)
(Continued)

(52) U.S. Cl.
CPC ...... *H01L 29/7827* (2013.01); *H01L 21/0217* (2013.01); *H01L 21/02164* (2013.01);
(Continued)

(58) Field of Classification Search
CPC ........... H01L 21/02164; H01L 21/0217; H01L 21/02532; H01L 21/308; H01L 21/31053;
(Continued)

(56) References Cited

U.S. PATENT DOCUMENTS 8,324,060 B2 * 12/2012 Park ................... H01L 27/11524
438/301
9,837,420 B1 12/2017 Ramaswamy
(Continued)

FOREIGN PATENT DOCUMENTS

WO WO 6/2020
PCT/US2018/062751

OTHER PUBLICATIONS

WO PCT/US2018/062751 Search Rept., dated Mar. 22, 2019, Micron Technology, Inc.
(Continued)

*Primary Examiner* — Meiya Li
(74) *Attorney, Agent, or Firm* — Wells St. John P.S.

(57) ABSTRACT

Some embodiments include an assembly having pillars of semiconductor material arranged in rows extending along a first direction. The rows include spacing regions between the pillars. The rows are spaced from one another by gap regions. Two conductive structures are within each of the gap regions and are spaced apart from one another by a separating region. The separating region has a floor section with an undulating surface that extends across semiconductor segments and insulative segments. The semiconductor segments have upper surfaces which are above upper surfaces of the insulative segments; Transistors include channel regions within the pillars of semiconductor material, and include gates within the conductive structures. Some embodiments include methods for forming integrated circuitry.

21 Claims, 27 Drawing Sheets

Related U.S. Application Data

(60) Provisional application No. 62/609,875, filed on Dec. 22, 2017.

(51) Int. Cl.

| | | |
|---|---|---|
| *H01L 29/66* | (2006.01) | |
| *H01L 21/8234* | (2006.01) | |
| *H01L 21/02* | (2006.01) | |
| *H01L 21/3105* | (2006.01) | |
| *H01L 29/10* | (2006.01) | |
| *H01L 23/528* | (2006.01) | |
| *H01L 29/06* | (2006.01) | |
| *H01L 21/308* | (2006.01) | |
| *H01L 21/311* | (2006.01) | |
| *H01L 27/108* | (2006.01) | |
| *H01L 27/24* | (2006.01) | |
| *H01L 21/762* | (2006.01) | |
| *H01L 23/49* | (2006.01) | |
| *H01L 21/764* | (2006.01) | |

(52) U.S. Cl.
CPC ...... *H01L 21/02532* (2013.01); *H01L 21/308* (2013.01); *H01L 21/31053* (2013.01); *H01L 21/31111* (2013.01); *H01L 21/76224* (2013.01); *H01L 21/823412* (2013.01); *H01L 21/823462* (2013.01); *H01L 21/823475* (2013.01); *H01L 21/823481* (2013.01); *H01L 21/823487* (2013.01); *H01L 23/49* (2013.01); *H01L 23/528* (2013.01); *H01L 27/10805* (2013.01); *H01L 27/10873* (2013.01); *H01L 27/10891* (2013.01); *H01L 27/2454* (2013.01); *H01L 29/0649* (2013.01); *H01L 29/1037* (2013.01); *H01L 29/66666* (2013.01); *H01L 21/764* (2013.01)

(58) Field of Classification Search
CPC ......... H01L 21/31111; H01L 21/76224; H01L 21/764; H01L 21/823412; H01L 21/823462; H01L 21/823475; H01L 21/823481; H01L 21/823487; H01L 23/49; H01L 23/528; H01L 27/10805; H01L 27/10873; H01L 27/10891; H01L 27/2454; H01L 29/0649; H01L 29/1037; H01L 29/66666; H01L 29/7827; H01L 27/11582; H01L 21/823821; H01L 29/792; H01L 27/11568; H01L 29/0847; H01L 29/66833; H01L 27/11565; H01L 29/42344; H01L 27/0207; H01L 27/11556; H01L 29/7851

See application file for complete search history.

(56) References Cited

U.S. PATENT DOCUMENTS

| | | | |
|---|---|---|---|
| 2004/0102007 A1* | 5/2004 | Rudeck | H01L 29/7883 438/259 |
| 2007/0018206 A1 | 1/2007 | Forbes | |
| 2007/0051994 A1* | 3/2007 | Song | H01L 27/10844 257/296 |
| 2010/0047995 A1* | 2/2010 | Apodaca | H01L 45/1233 438/429 |
| 2011/0156120 A1* | 6/2011 | Kujirai | H01L 29/66666 257/306 |
| 2011/0215396 A1 | 9/2011 | Tang et al. | |
| 2011/0305074 A1 | 12/2011 | Lung et al. | |
| 2016/0086957 A1 | 3/2016 | Cho et al. | |
| 2017/0301731 A1 | 10/2017 | Masuoka et al. | |

OTHER PUBLICATIONS

WO PCT/US2018/062751 Writ. Opin., dated Mar. 22, 2019, Micron Technology, Inc.

* cited by examiner

METHODS OF FORMING INTEGRATED CIRCUITRY

RELATED PATENT DATA

This application resulted from a divisional of U.S. patent application Ser. No. 15/976,720 filed May 10, 2018, which claims priority to U.S. provisional application Ser. No. 62/609,875, which was filed Dec. 22, 2017, each of which is hereby incorporated by reference herein.

TECHNICAL FIELD

Assemblies having conductive structures along pillars of semiconductor material, and methods of forming integrated circuitry.

BACKGROUND

Integrated circuitry may include vertically-extending pillars of semiconductor material. Such pillars may be arranged in an array. The array may be considered to comprise rows and columns; with the columns crossing the rows.

The pillars may be incorporated into transistors. The transistors may comprise conductive gates along the pillars. Conductive wordlines may extend along the rows of the array, and may be electrically coupled with the conductive gates of the transistors.

The transistors may be incorporated into memory/storage, logic, sensors and/or any other suitable application.

A continuing goal of integrated circuit fabrication is to increase integration density, and an associated goal is to scale devices to increasingly smaller dimensions. It would be desirable to develop improved methods for fabricating the above-described transistors, and to develop new architectures comprising such transistors.

BRIEF DESCRIPTION OF THE DRAWINGS

FIGS. 3-11 are top views of the assembly. FIGS. 3A-11A are views along the lines A-A of FIGS. 3-11, FIGS. 7B-11B are views along the lines B-B of FIGS. 7-11, FIGS. 7C-11C are views along the lines C-C of FIGS. 7-11, and FIGS. 7D-11D are views along the lines D-D of FIGS. 7-11.

FIGS. 13A-16A are views along the lines A-A of FIGS. 13-16, FIGS. 13B-16B are views along the lines B-B of FIGS. 13-16, FIGS. 13C-16C are views along the lines C-C of FIGS. 13-16, and FIGS. 13D-16D are views along the lines D-D of FIGS. 13-16.

DETAILED DESCRIPTION OF THE ILLUSTRATED EMBODIMENTS

Some embodiments include methods for fabricating transistors. The transistors may have channel regions within vertically-extending pillars of semiconductor material, and may have gates along the pillars. The semiconductor material pillars may be formed within an array, with such array having rows extending along a first direction and columns extending along a second direction which intersects the first direction. The rows may initially comprise the semiconductor material pillars alternating with insulative material. Subsequently, the insulative material may be recessed, or even entirely removed from between the semiconductor material pillars, and then conductive lines may be formed to extend along the rows of the semiconductor material pillars. The conductive lines may include regions corresponding to the gates of the transistors, and such regions may wrap partially, or even entirely, around the semiconductor material pillars. The semiconductor material pillars may comprise channel regions of the transistors, and the wrap of the transistor gates around the semiconductor material pillars may advantageously enable strong coupling between the gates and the channel regions during operation of the transistors.

Transistors fabricated according to methodology described herein may be utilized in any suitable application(s); including, for example, memory/storage, logic, sensors, etc.

Example embodiments are described with reference to FIGS. 1-18.

A first example method for fabricating example integrated circuitry is described with reference to FIGS. 1-11.

Figure 1:
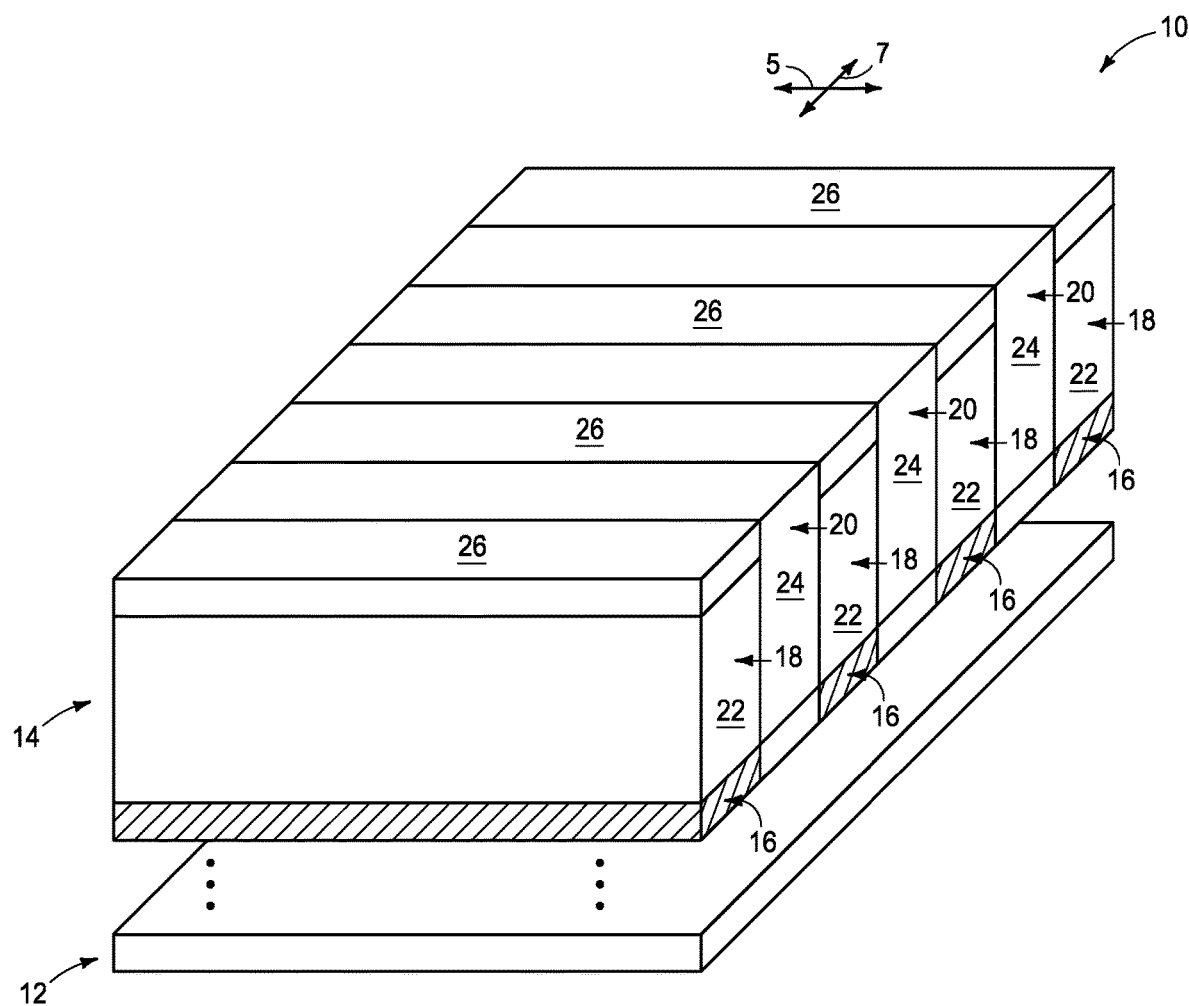
FIG. 1 is a diagrammatic three-dimensional view of an assembly at an example process stage.

Referring to FIG. 1, an assembly (i.e., construction) 10 comprises a structure 14 supported by a base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. A gap is provided between the substrate 12 and the structure 14 to indicate that there may be other materials, circuitry, etc., between the base 12 and the structure 14. For instance, insulative material may be provided between the structure 14 and the base 12.

The structure 14 comprises a plurality of conductive lines 16 which extend along a first direction, with the first direction being diagrammatically indicated with an axis 5. The conductive lines 16 may correspond to digit lines associated with a memory array, and/or may correspond to circuitry associated with logic, sensors, etc.

The conductive lines 16 may comprise any suitable electrically conductive composition(s); and in some embodiments may, for example, include one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

First rails 18 are directly over the conductive lines 16, and extend along the first direction of axis 5. Second rails 20 are between the first rails 18. The first and second rails 18 and 20 alternate with one another along a second direction, with the second direction being diagrammatically illustrated with an axis 7. The second direction represented by the axis 7 crosses the first direction represented by the axis 5. In some embodiments, the second direction represented by the axis 7 may be substantially orthogonal to the first direction represented by the axis 5, with the term "substantially orthogonal" meaning orthogonal to within reasonable tolerances of fabrication and measurement.

The first rails 18 comprise semiconductor material 22, and the second rails 20 comprise insulative material 24.

The semiconductor material 22 may comprise any suitable composition or combination of compositions; and in some embodiments may comprise one or more of silicon, germanium, III/V materials, semiconductor oxides, etc.

The insulative material 24 may comprise any suitable composition or combination of compositions; and in some embodiments may comprise, consist essentially of, or consist of silicon dioxide.

The first rails 18 are capped with a protective capping material 26. The protective capping material 26 may comprise any suitable composition or combination of compositions; and in some embodiments may comprise, consist essentially of, or consist of silicon nitride.

In some embodiments, the materials 24 and 26 may be referred to as first and second materials, respectively; with the first material 24 being selectively etchable relative to the second material 26.

The assembly 10 of FIG. 1 may be fabricated with any suitable processing. Persons ordinary skill in the art will recognize suitable methods for fabricating such assembly.

Figure 2:
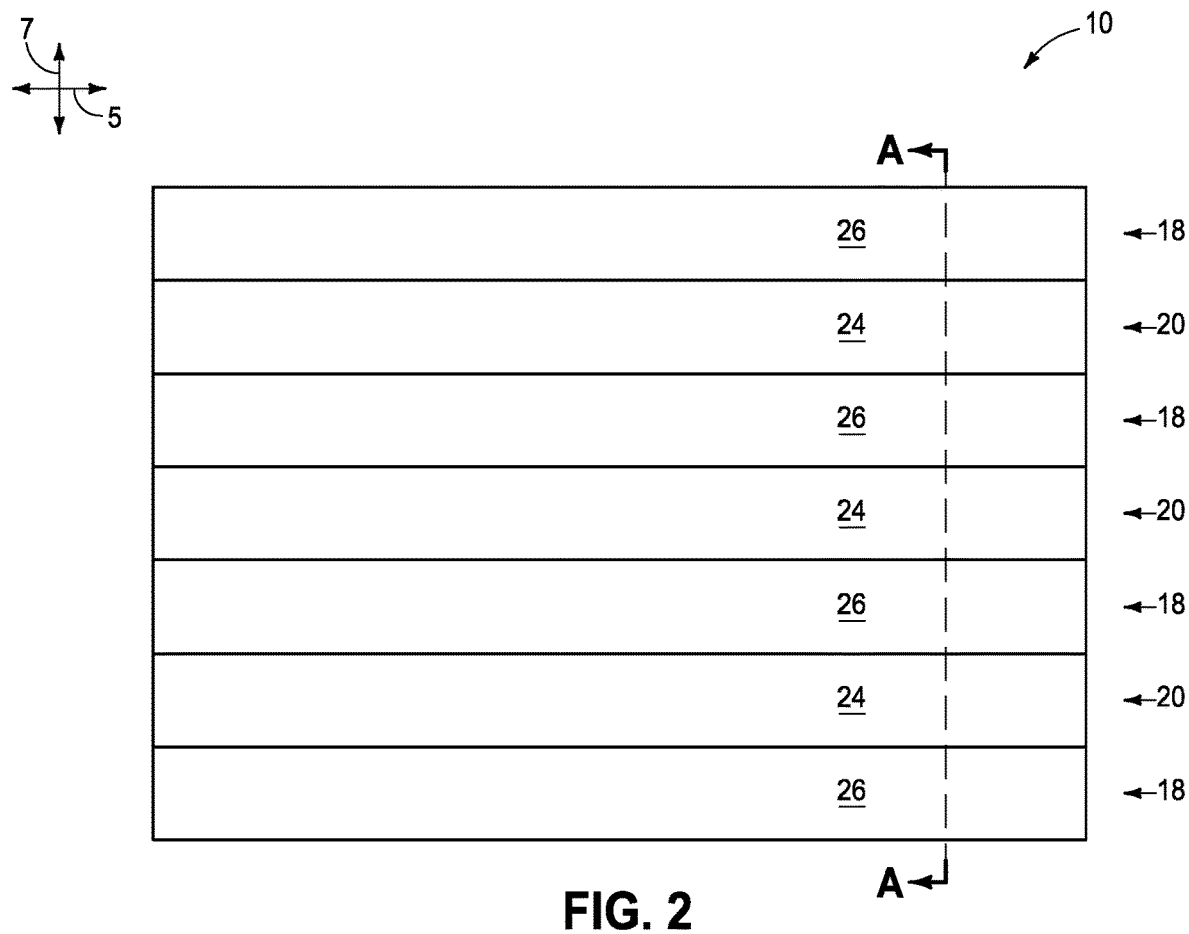
FIG. 2 is a top view of the assembly of FIG. 1.
Figure 2A:
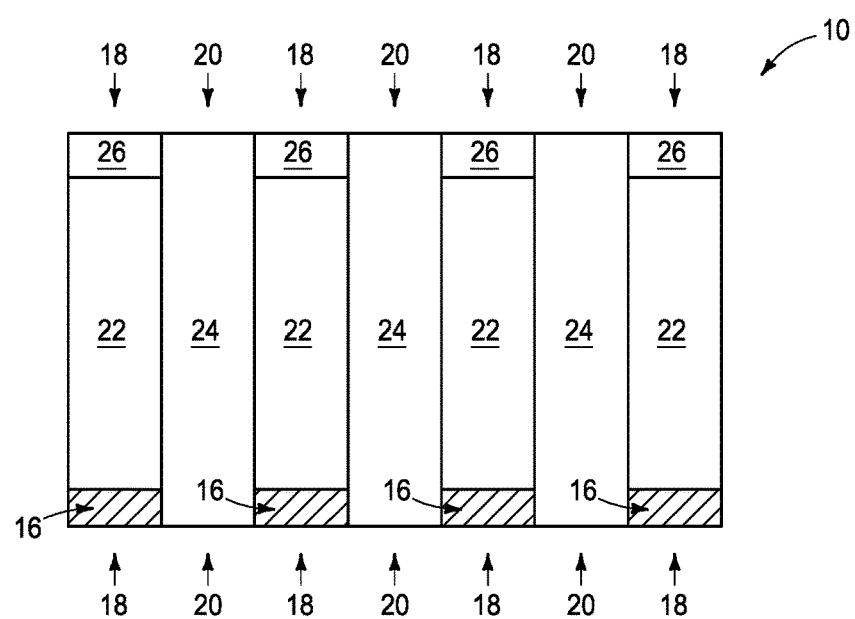
FIG. 2A is a cross-sectional diagrammatic side view along the line A-A of FIG. 2.

The three-dimensional view of FIG. 1 is helpful for explaining the relationship between the rails 18 and 20, and the relationship between the structure 14 and the underlying base 12. However, methodology of the present invention may be easier to describe using two-dimensional views rather than with three-dimensional views. Accordingly, FIGS. 2 and 2A are provided to illustrate construction 10 with two-dimensional views. FIG. 2 shows a top view of construction 10, and FIG. 2A shows a cross-sectional view along the line A-A of FIG. 2. The underlying base 12 is not shown in FIG. 2A in order to simplify the drawing, but it is to be understood that the appropriate base may be provided to support the illustrated structure of FIGS. 2 and 2A.

Figure 3:
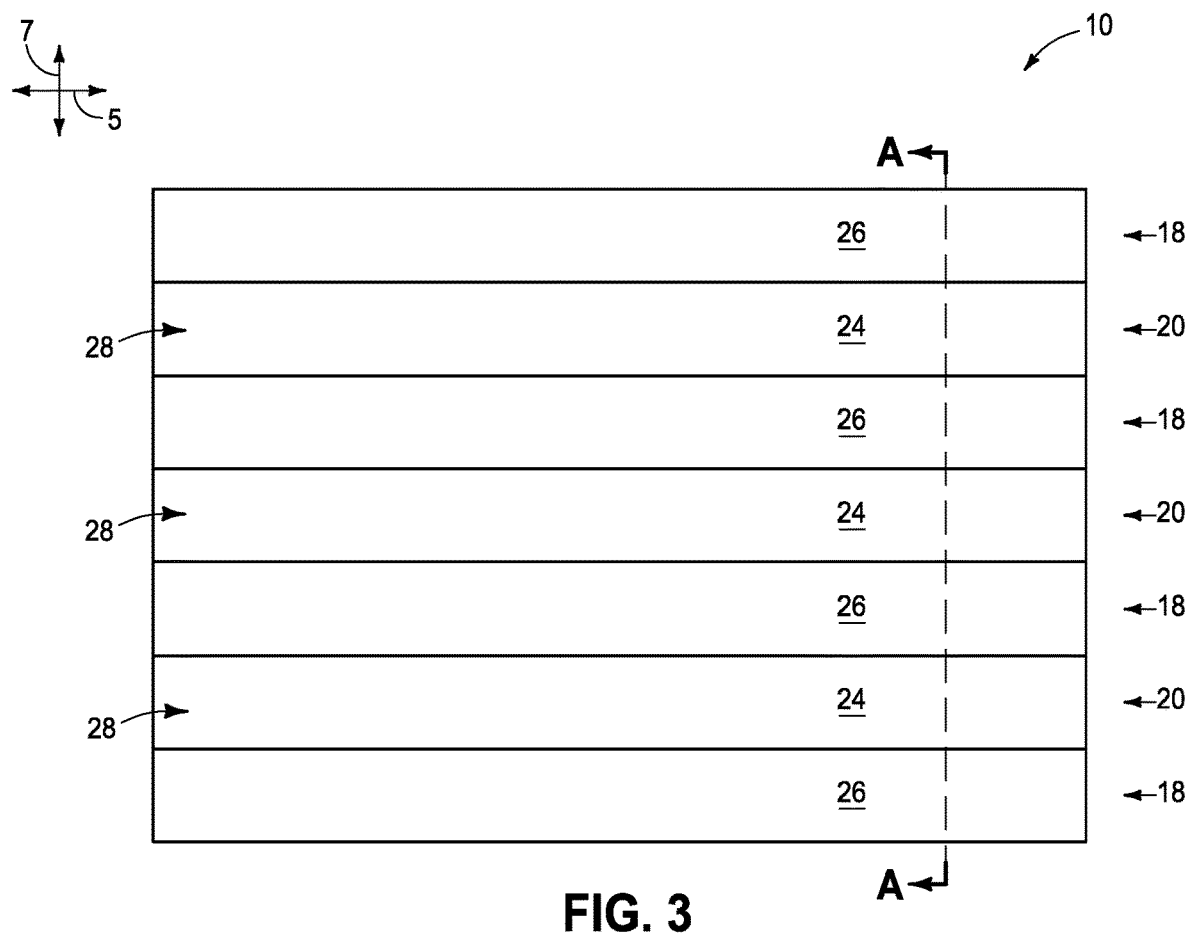
FIGS. 3-11 show the construction of FIGS. 1 and 2 at example process stages of an example method for fabricating an example assembly. The assembly of FIG. 6 may be equivalent to that of FIG. 5 in some embodiments; with the views following FIG. 6 using the manner of illustration of FIG. 6 instead of that of FIG. 5 in order to simplify the drawings.
Figure 3A:
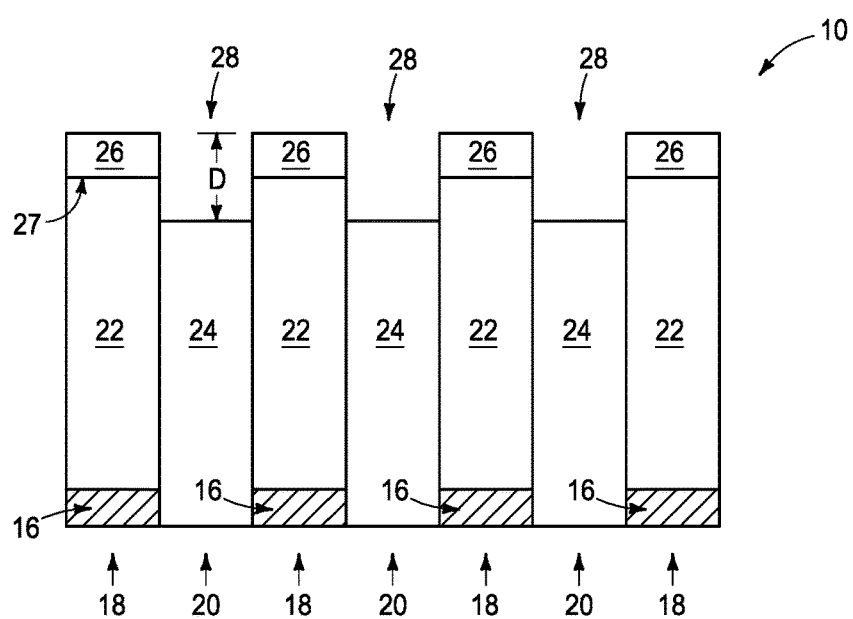

Referring to FIGS. 3 and 3A, the second rails 20 are recessed relative to the first rails 18; and specifically, the insulative material 24 of the second rails 18 is recessed relative to the protective capping material 26 and the semiconductor material 22 of the first rails 18. Such recessing may be accomplished utilizing one or more appropriate etches. The recessing forms trenches 28, with such trenches extending along the first direction of axis 5. In some embodiments, the trenches 28 may be referred to as first trenches to distinguish them from other trenches formed during subsequent processing.

The second rails 20 are recessed to a depth D. Such depth may be any suitable depth, and in some embodiments is within a range of from about 20 nanometers (nm) to about 100 nm. In the shown embodiment, the second rails 20 are recessed to a depth below bottom surfaces 27 of the protective capping material 26.

Figure 4:
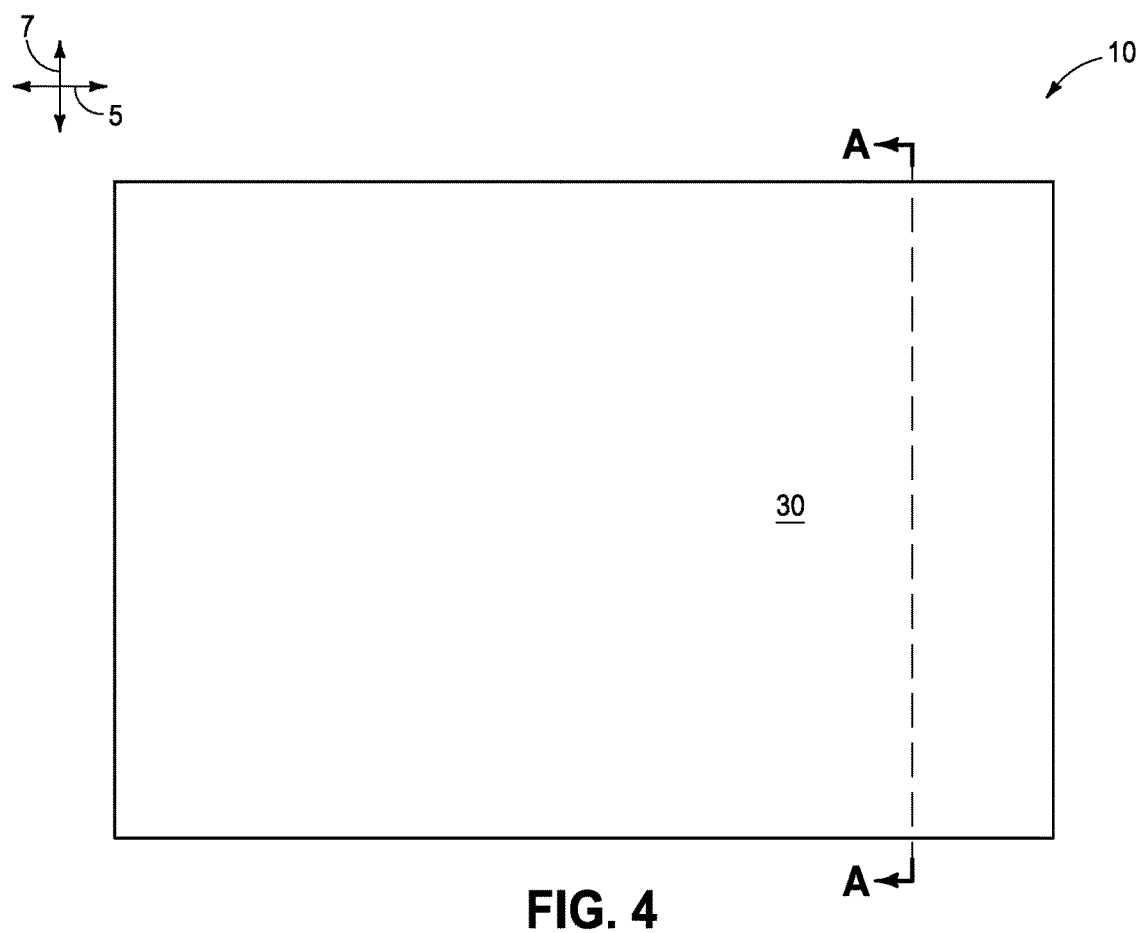
Figure 4A:
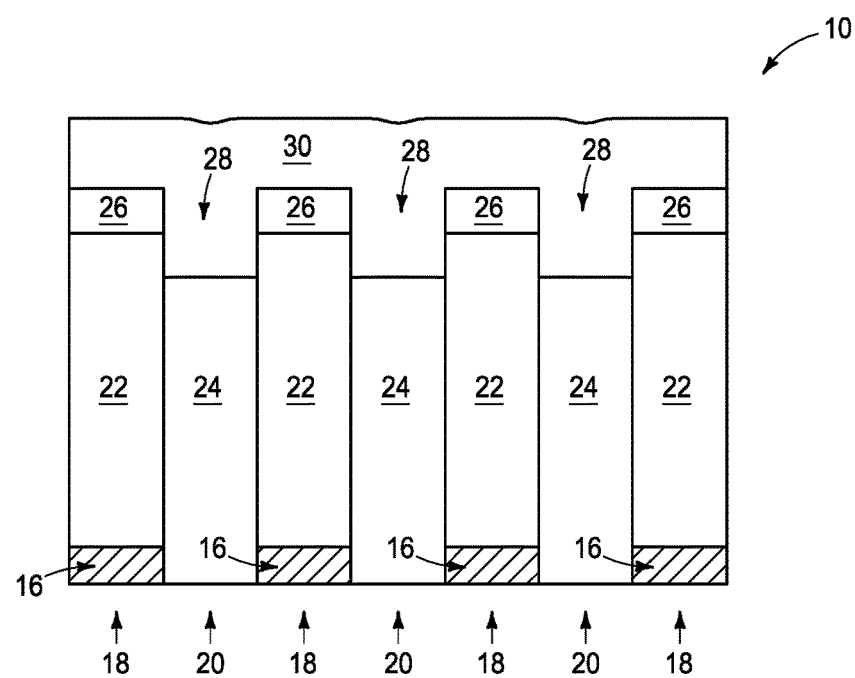

Referring to FIGS. 4 and 4A, a material 30 is formed over the protective capping material 26 and within the trenches 28. In some embodiments, the materials 26 and 30 may be referred to as first and second protective capping materials, respectively. The second protective capping material 30 may comprise a same composition as the first protective capping material 26. For instance, in some embodiments the first and second protective capping materials 26 and 30 may both comprise, consist essentially of, or consist of silicon nitride. Alternatively, the second protective capping material 30 may comprise a different composition relative to the first protective capping material 26. For instance, in some embodiments the second protective capping material 30 may comprise, consist essentially of, or consist of carbon-doped silicon dioxide; while the first protective capping material 26 comprises, consists essentially of, or consists of silicon nitride. Although materials 26 and 30 are shown to be homogeneous materials, in some embodiments one or both of them may include two or more different compositions. For instance, FIGS. 17 and 18 (described below) illustrate an embodiment in which the second protective capping material 30 comprises both silicon nitride and silicon dioxide.

In some embodiments, the protective capping materials 26 and 30 are sacrificial materials; and in such embodiments the protective materials 26 and 30 may comprise any materials having suitable etch properties, including metals, oxides, nitride, carbide, silicide, etc.

In some embodiments, at least one of the protective materials 26 and 30 remains in a final construction, and in such embodiments it may be desired that the remaining protective material have physical properties suitable for its remaining location in an integrated circuit. For instance, it may be desired that any portions of the protective materials 26 and 30 remaining in a final construction be electrically insulative.

Figure 5:
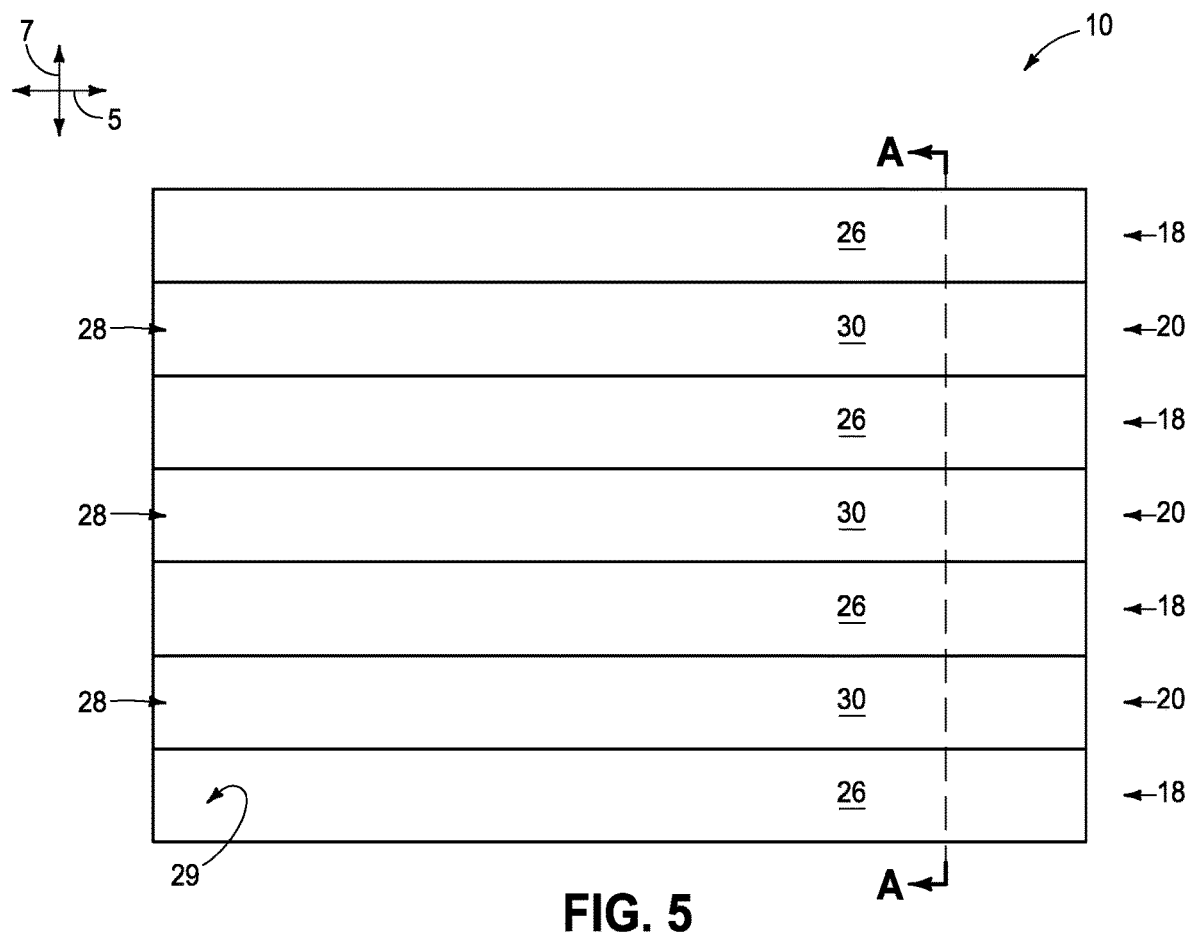
Figure 5A:
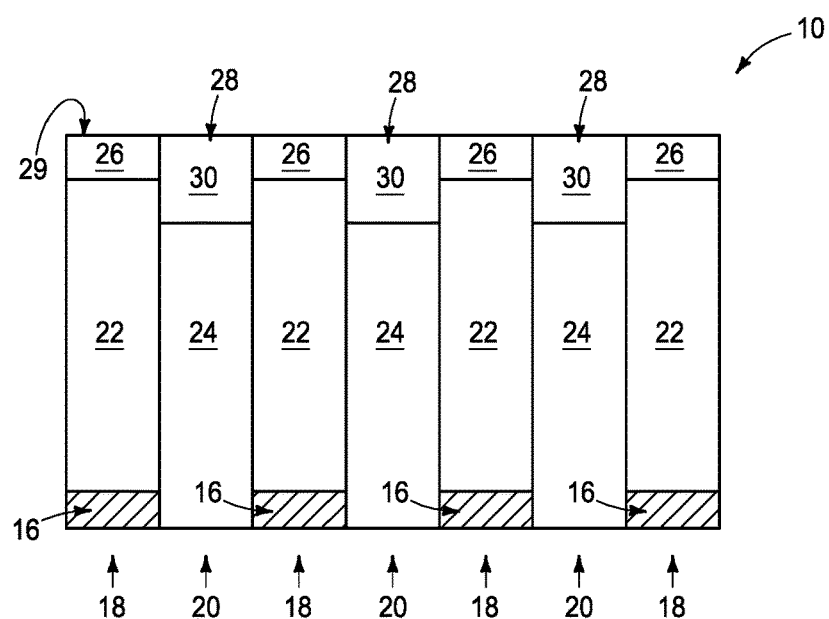

Referring to FIGS. 5 and 5A, assembly 10 is subjected to a suitable planarization process (for instance, chemical-mechanical polishing) to form a planarized surface 29 extending across an upper surface of the assembly 10. In the illustrated embodiment, the polishing removes the second protective capping material 30 from over the first protective capping material 26, while leaving the second protective capping material 30 within the trenches 28.

Figure 6:
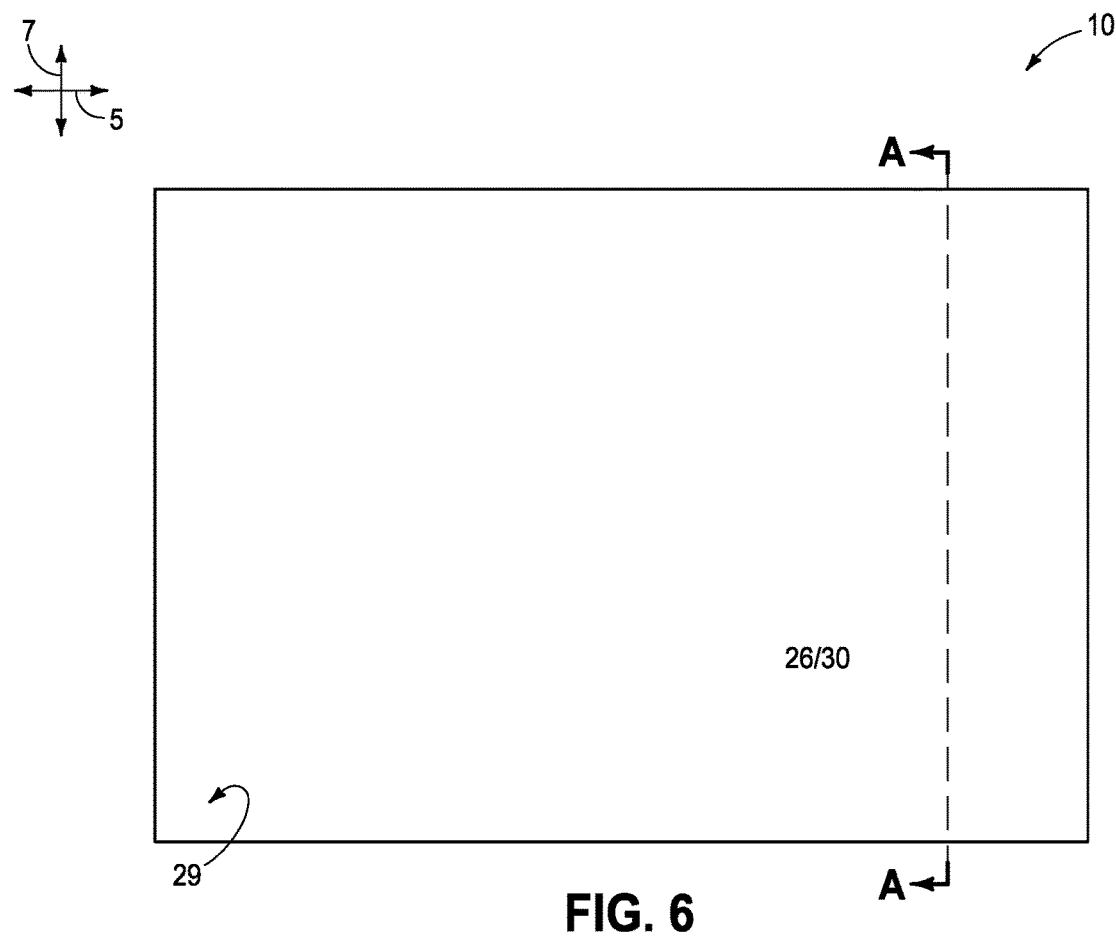
Figure 6A:
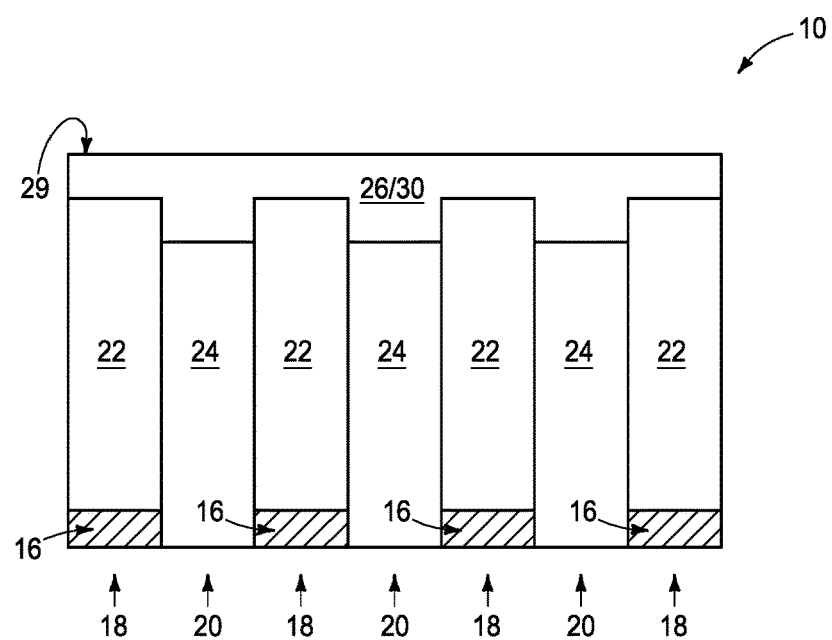

FIGS. 5 and 5A show materials 26 and 30 as separate materials which are distinguishable from one another. However, in some embodiments the materials may be a common composition with one another, and accordingly may merge to form a single composition extending across the rails 18 and 20. Such is illustrated in FIGS. 6 and 6A, where the materials 26 and 30 merge to form a single material 26/30. It will simplify the drawings which follow to show only the single protective material 26/30, rather than the separate materials 26 and 30. However, it is to be understood that even though the drawings following FIG. 6 show materials 26 and 30 merging into a single material 26/30, in some embodiments the materials 26 and 30 may comprise different compositions from one another rather than comprising a common composition.

Figure 7:
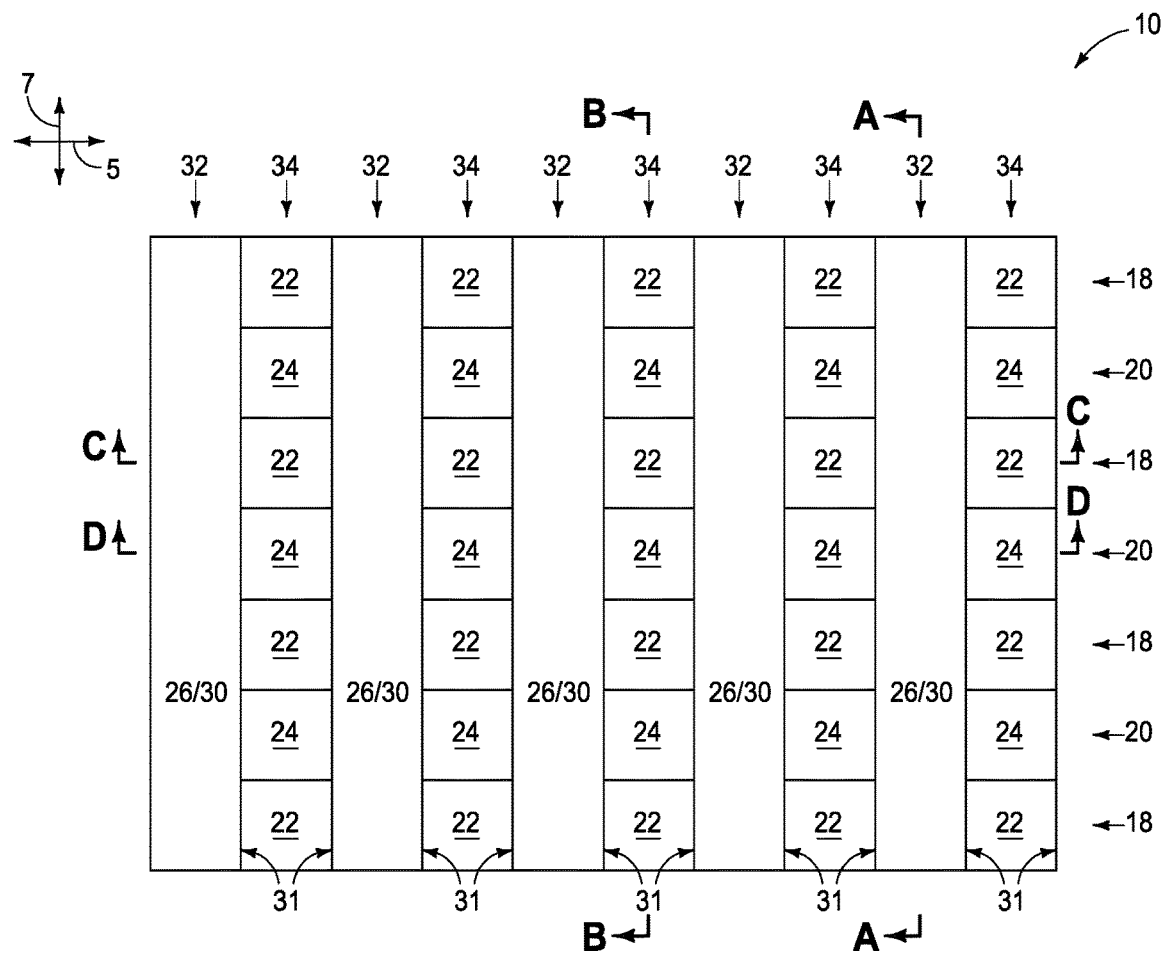
Figure 7A:
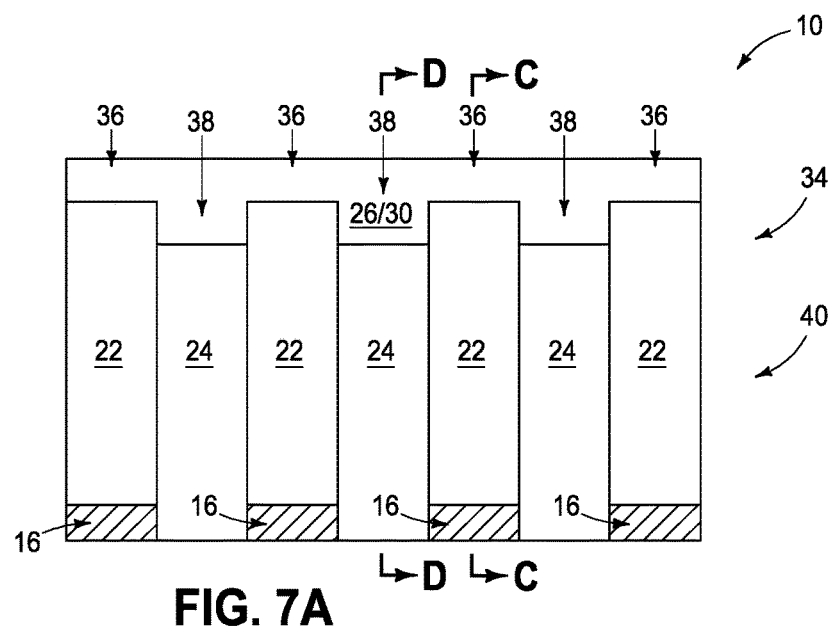
Figure 7B:
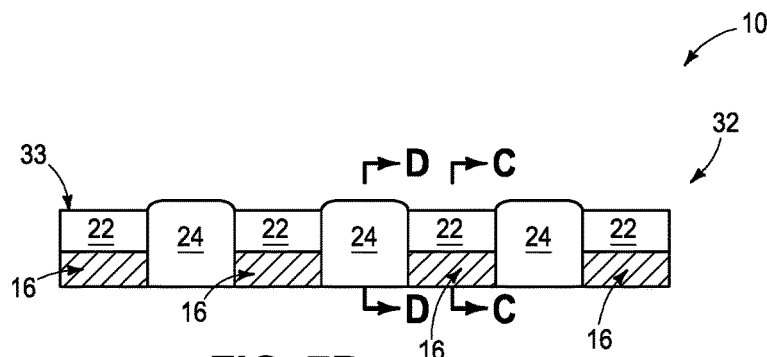
Figure 7C:
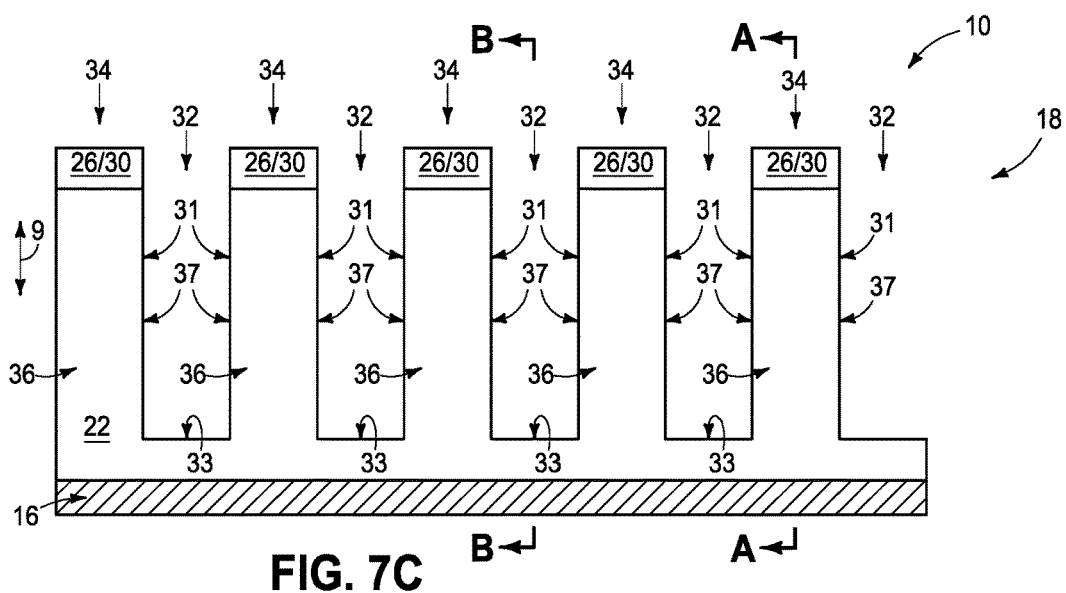
Figure 7D:
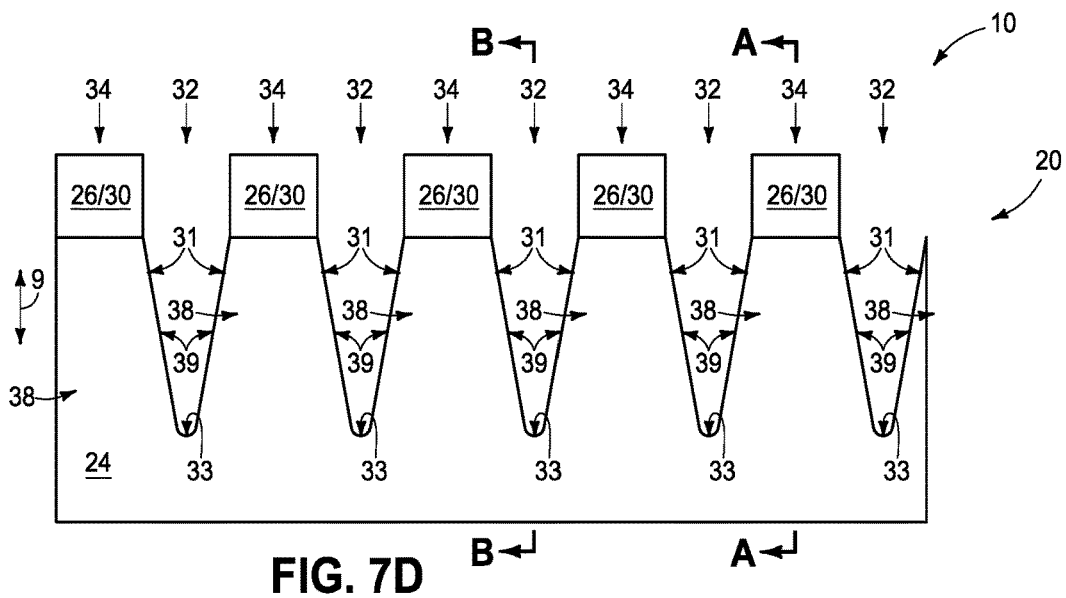

Referring to FIGS. 7-7D, trenches 32 are formed to extend along the second direction of axis 7. The trenches 32 extend through the protective capping material 26/30 and into the first and second rails 18 and 20. The trenches 32 are spaced from one another by intervening regions 34 (which may be referred to as intervening linear structures in some embodiments). The intervening regions 34 comprise alternating first and second pillars 36 and 38 (as shown in FIG. 7A); with the first pillars 36 comprising semiconductor material 22, and the second pillars 38 comprising insulative material 24. In some embodiments, the trenches 32 may be referred to as second trenches to distinguish them from the first trenches 28 described above with reference to FIG. 3.

The first pillars 36 of semiconductor material 22 may be considered to be patterned into rows 40 after the formation of trenches 32, with each row being along the intervening regions 34 and extending along the second direction of axis 7 (one of the rows 40 is visible in the cross-sectional view of FIG. 7A). The first pillars 36 (i.e., the semiconductor material pillars) within each of the rows 40 may be considered to be spaced from one another by the insulative material 24 of the second pillars 38.

The trenches 32 have sidewall edges 31 (shown in FIGS. 7, 7C and 7D) and bottom edges 33 (shown in FIGS. 7B-7D). The semiconductor pillars 36 have sidewalls 37 along the sidewall edges 31 of the trenches 32, and the insulative pillars 38 have sidewalls 39 along the sidewall edges 31.

The trenches 32 may be formed with any suitable processing. For instance, a patterned mask (not shown) may be provided over the assembly 10 to define locations of the trenches 32, and the trenches 32 may then be etched into the materials 22, 24 and 26/30 utilizing one or more suitable etches. Subsequently, the patterned mask may be removed to leave the construction of FIGS. 7-7D.

A problem that may occur during the etching utilized to form trenches 32 is that the semiconductor material 22 may etch differently than the insulative material 24. For instance, it may be found that the sidewalls 39 along the insulative material pillars 38 are less vertical than the sidewalls 37 along the sidewall edges of the semiconductor material pillars 36. Ideally, the sidewalls should be substantially vertical (with the term "substantially vertical" meaning vertical to within reasonable tolerances of fabrication and measurement). For instance, it may be desired that the sidewalls 31 of the trenches 32 be orthogonal (i.e., oriented at a 90° angle) relative to an upper surface of the base 12 (FIG. 1), with such orthogonal direction being represented by an axis 9 in FIGS. 7C and 7D. If the sidewalls are more than 1.5° off from the vertical axis 9, the taper along the sidewalls may problematically interfere with subsequent processing. In the illustrated application, the sidewalls 37 along the conductive material pillars 36 are shown to be substantially vertical (FIG. 7C), while the sidewalls along the insulative material pillars 38 are shown to be non-vertical (FIG. 7D).

Figure 8:
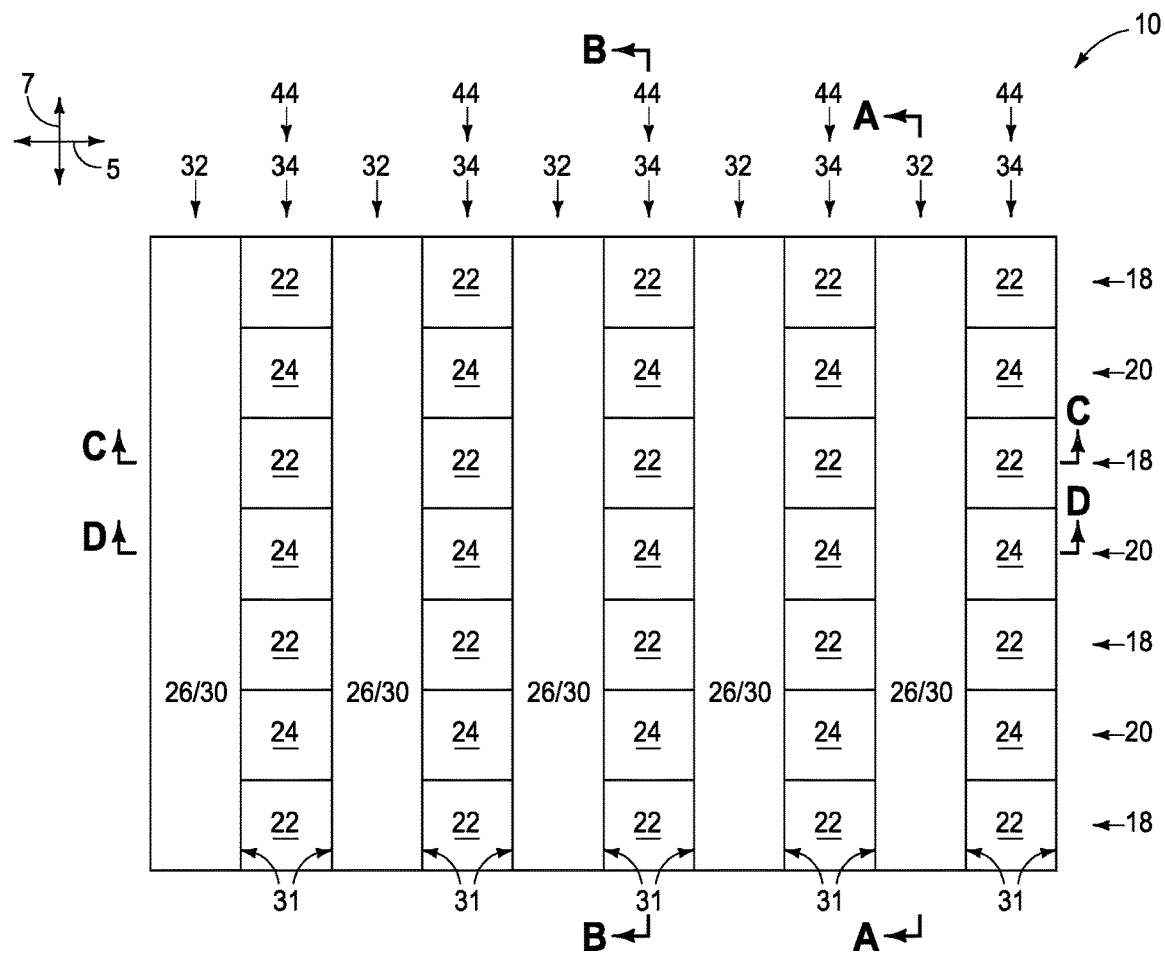
Figure 8A:
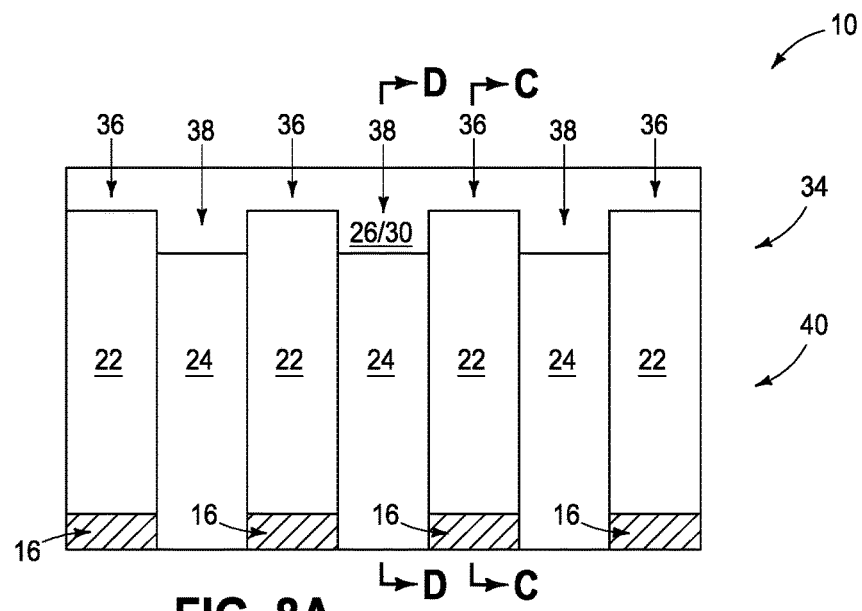
Figure 8B:
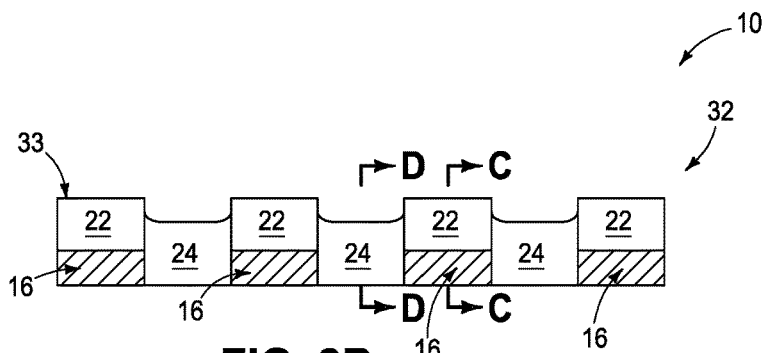
Figure 8C:
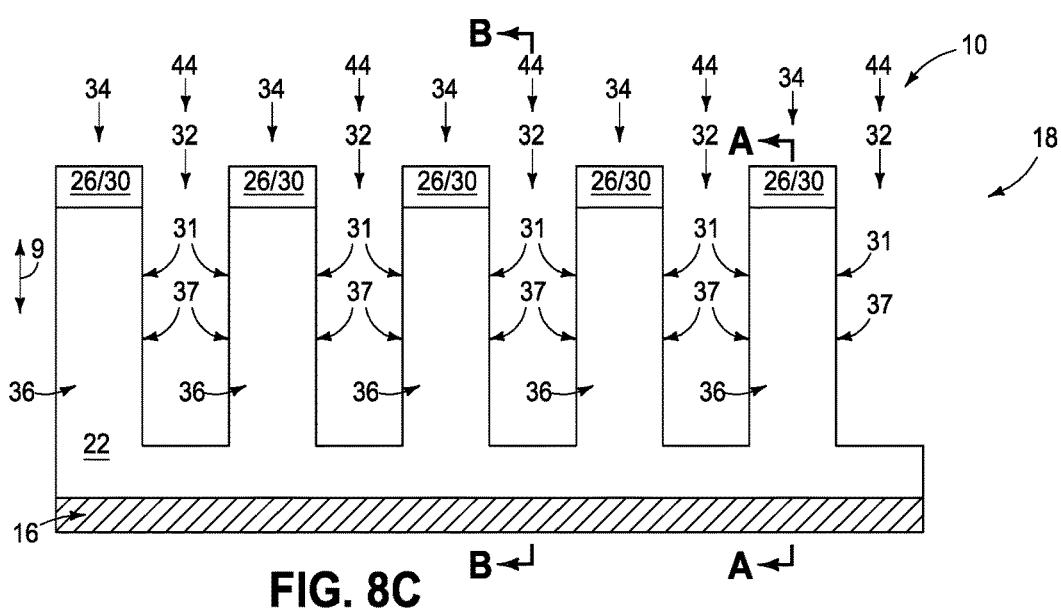
Figure 8D:
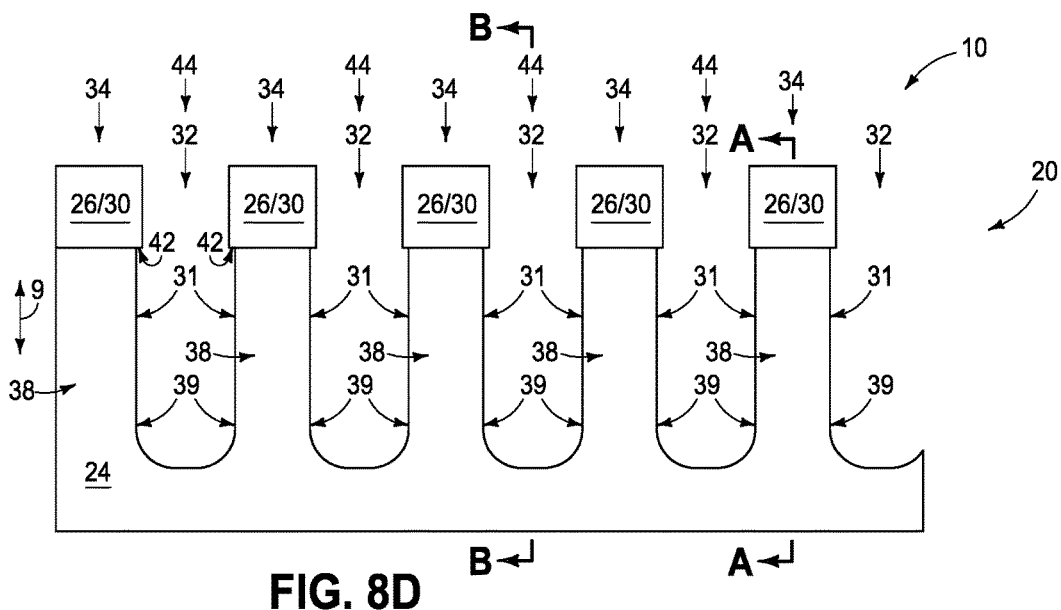

Referring to FIGS. 8-8D, the sidewalls 39 of the insulative material pillars 38 (i.e., the second pillars) are recessed relative to the sidewalls 37 of the semiconductor pillars 36 (i.e., the first pillars). Such recessing may be accomplished with any suitable etch or combination of etches, including, for example, a wet etch selective for an oxide material 24 (e.g., silicon dioxide) relative to the semiconductor material 22 (e.g., silicon) and the protective capping materials 26/30 (e.g., silicon nitride). In some embodiments, the etching utilized to selectively recess the sidewalls 39 of the insulative material 38 may utilize hydrofluoric acid, a plasma etch, and/or a reactive ion etch.

In the illustrated embodiment, the sidewalls 39 are etched until the sidewalls are substantially vertical, and until they are recessed to be inset relative to sidewall edges of the protective capping materials 26/30 along the intervening regions 34 (as shown in FIG. 8D), with such insetting leaving overhanging edges 42 of the protective materials 26/30 over the insulative material pillars 38.

After the sidewalls 39 of the insulative material pillars 38 are recessed, the trenches 32 may be considered to be converted into linear guides 44 which extend along the second direction of axis 7. Such linear guides have sidewall regions 31 comprising the rows 40 of the semiconductor pillars 36. The linear guides 44 have sidewall segments along the sidewall regions 31, with such sidewall segments comprising the sidewalls 37 of the semiconductor pillars 36, and comprising the sidewalls 39 of the insulative material pillars 38. In other embodiments (as discussed below with reference to FIGS. 13-16), the recessing of the insulative material pillars 38 may entirely remove the insulative material pillars 38 from between the second material pillars 36 along the rows 40, and accordingly the sidewall regions 31 of the linear guides 44 may comprise sidewalls 37 of the semiconductor pillars 36 and not the sidewalls 39 of the insulative material pillars 38. Such may advantageously enable gate wrap-around assemblies to be constructed, as discussed in more detail below with reference to FIGS. 13-16.

Figure 9:
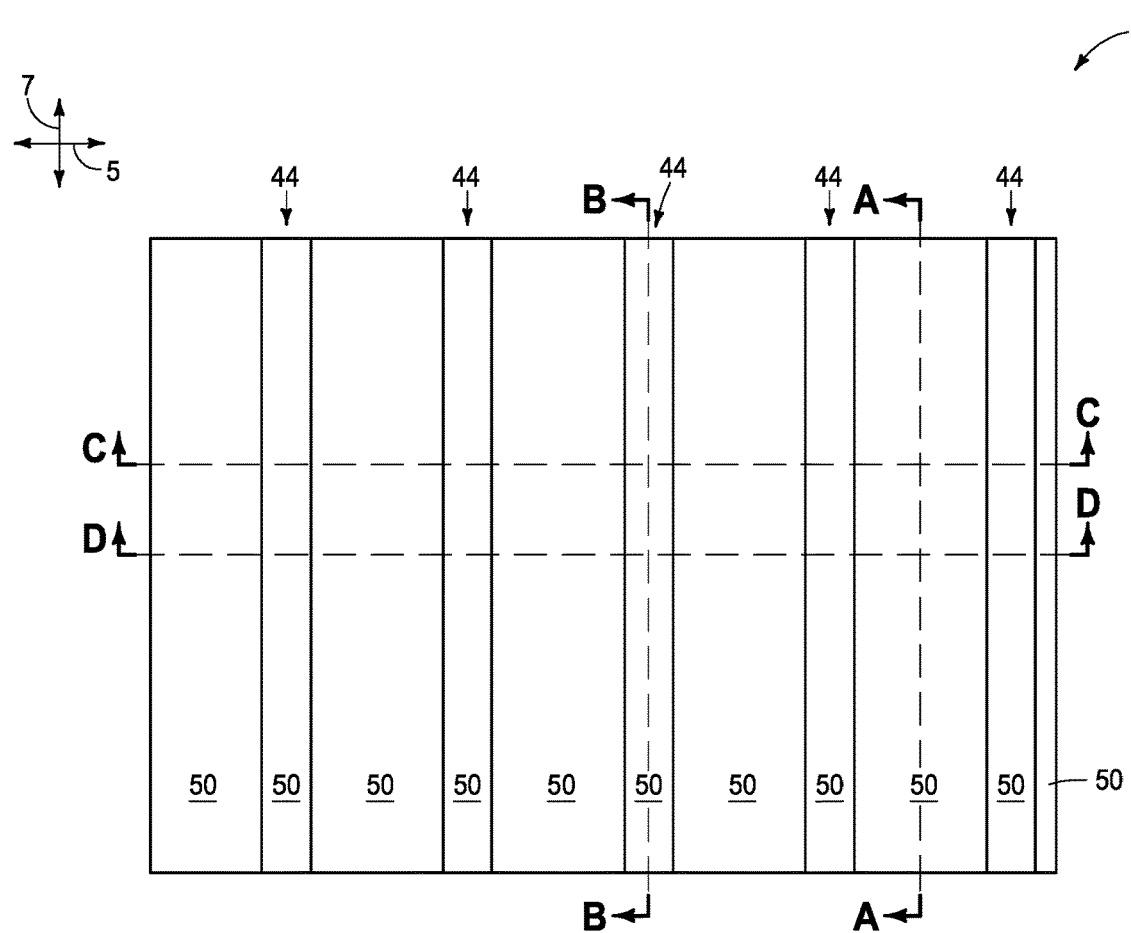
Figure 9A:
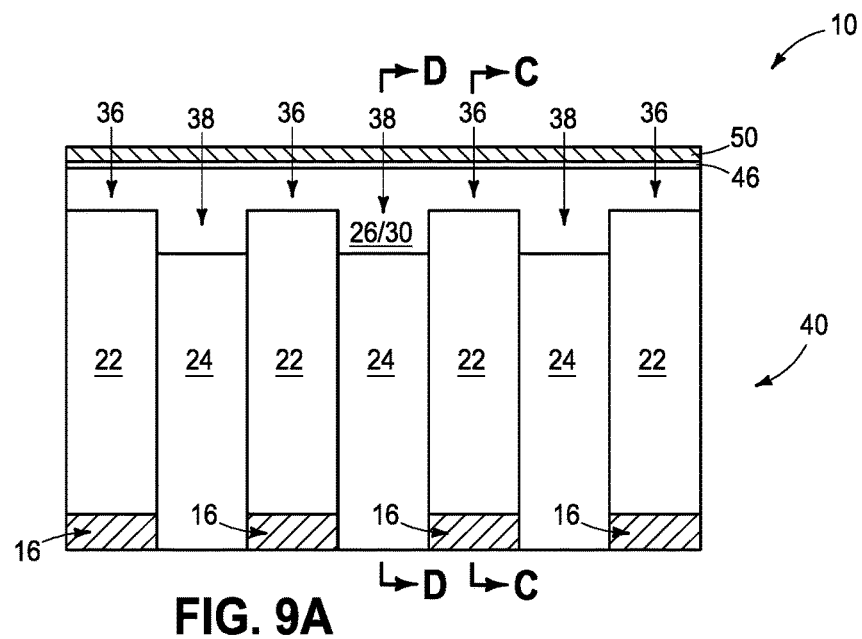
Figure 9B:
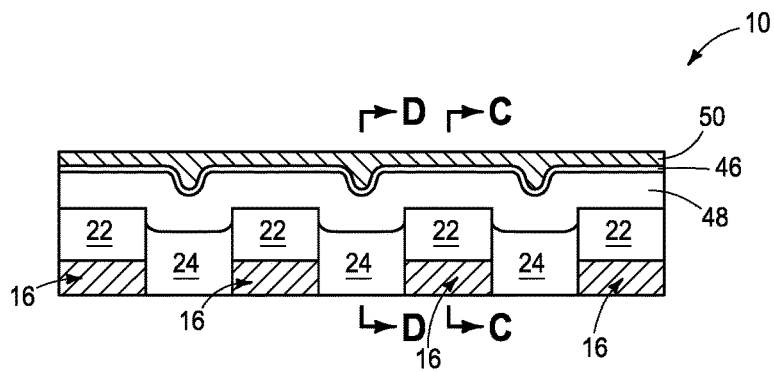
Figure 9C:
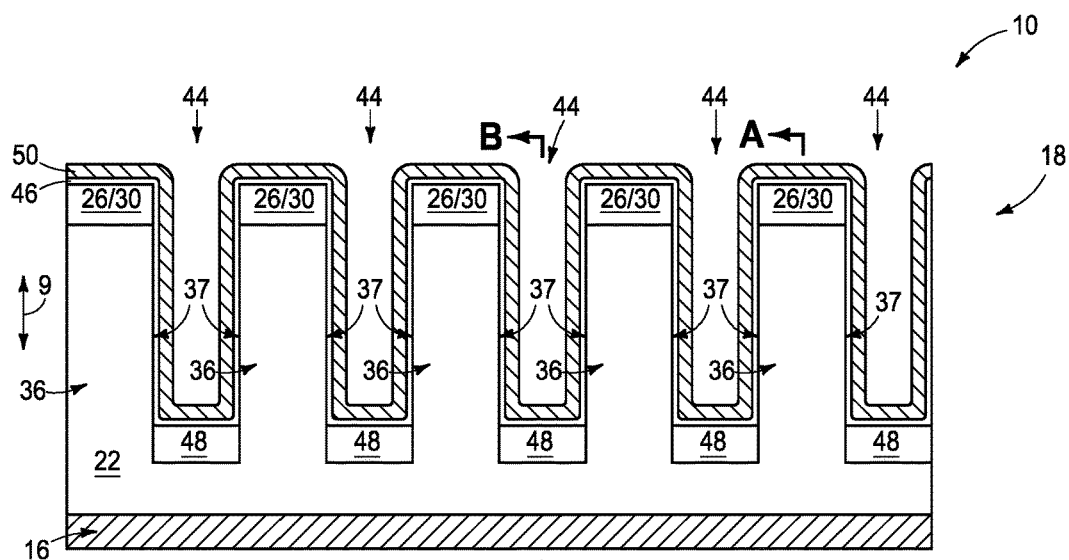
Figure 9D:
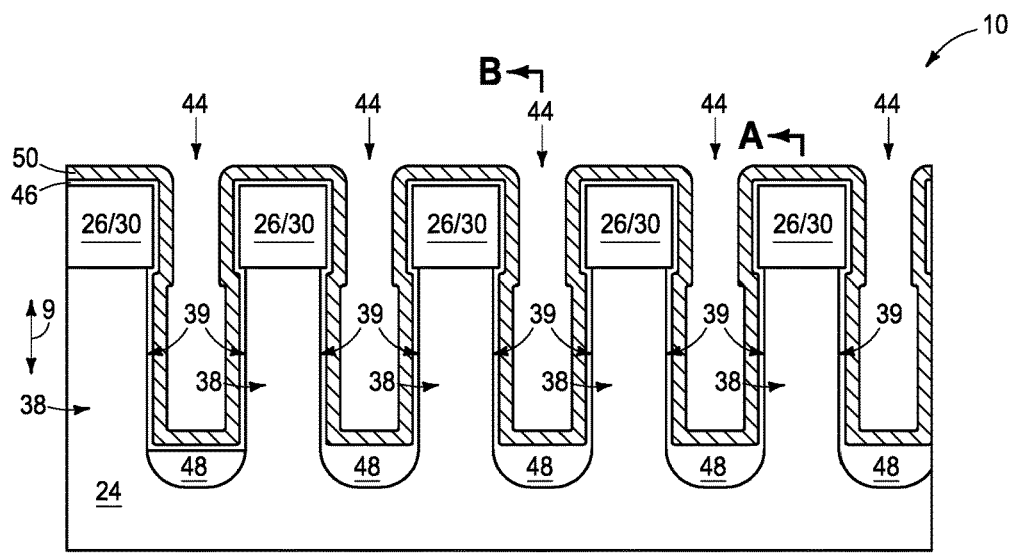

Referring to FIGS. 9-9D, insulative material spacers 48 (shown in FIGS. 9B-9D) are provided along the bottoms of the guide regions 44. The insulative material spacers 48 may comprise any suitable material such as, for example, one or more of silicon dioxide, silicon nitride, etc. The insulative material spacers are ultimately utilized to offset a bottom of a transistor gate relative to the semiconductor pillars 36. Persons ordinary skill in the art can determine an appropriate thickness for the insulative material spacers 48 to accomplish the desired offset.

Gate dielectric material 46 is formed along the sidewalls 37 of the semiconductor material pillars 36. In the shown embodiment, the gate dielectric material 46 extends over the pillars 36 and 38, and along the sidewalls 39 of the insulative material pillars 38, as well as along the sidewalls 37 of the semiconductor pillars 36. Such may occur in applications in which the gate dielectric material is uniformly deposited across all surfaces of the construction 10. In other embodiments, the gate dielectric material 46 may be grown from semiconductor material 22 of the pillars 36 (for instance, if the semiconductor material 22 comprises silicon, the gate dielectric material 46 may comprise silicon dioxide grown along surfaces of the silicon), and in such embodiments the gate dielectric material 46 may be only formed along the sidewalls 37 of the semiconductor material pillars 36.

Conductive material 50 is formed over the gate dielectric material 46. The conductive material 50 may comprise any suitable composition(s), such as, for example, one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 50 may comprise metal; and may include, for example, one or more of titanium, tantalum tungsten, ruthenium, titanium nitride, tantalum nitride, tungsten nitride, etc.

Figure 10:
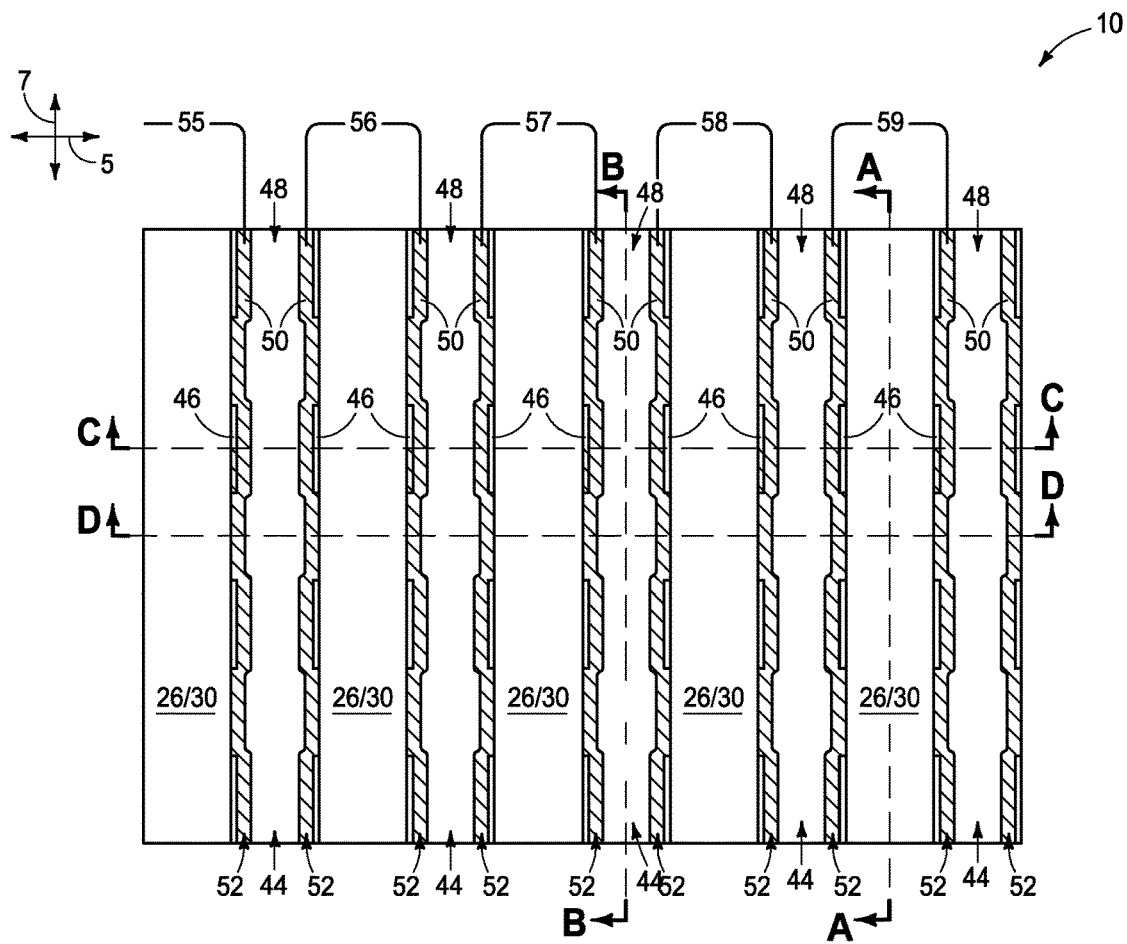
Figure 10A:
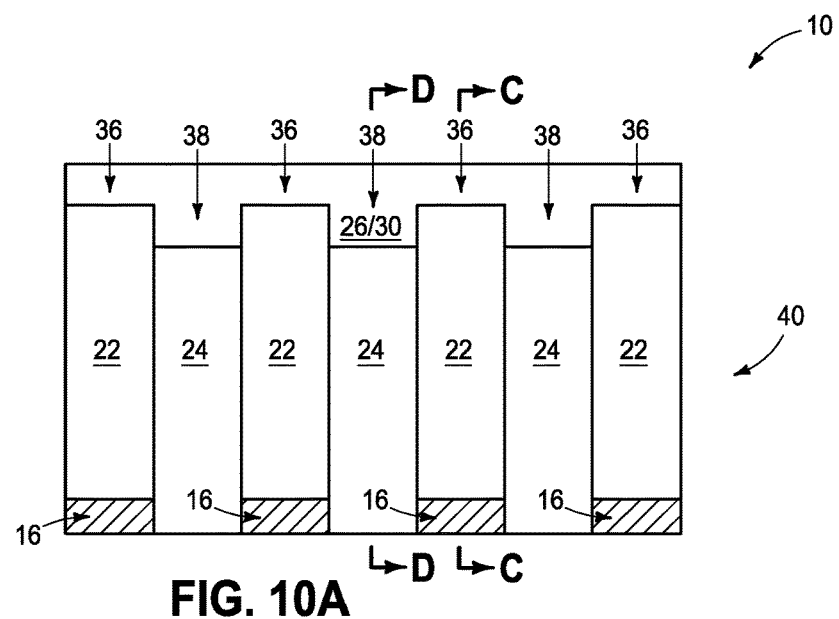
Figure 10B:
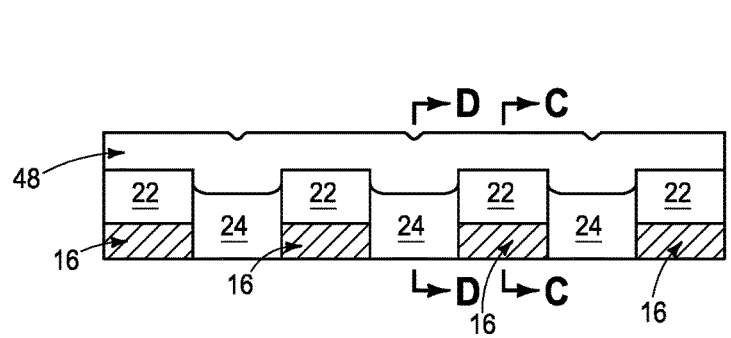
Figure 10C:
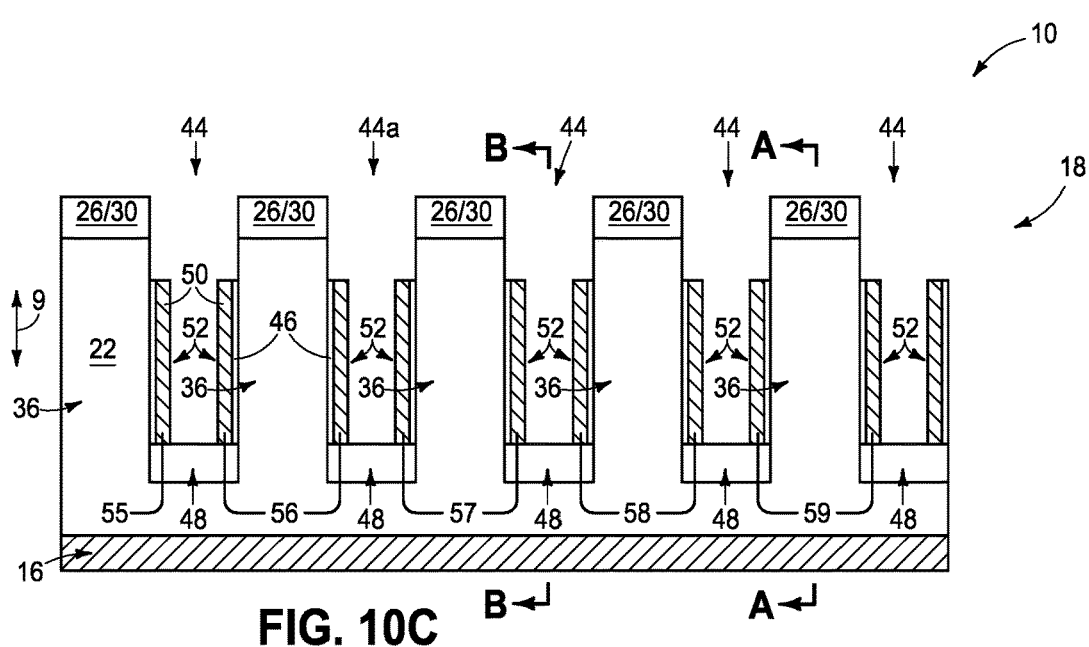
Figure 10D:
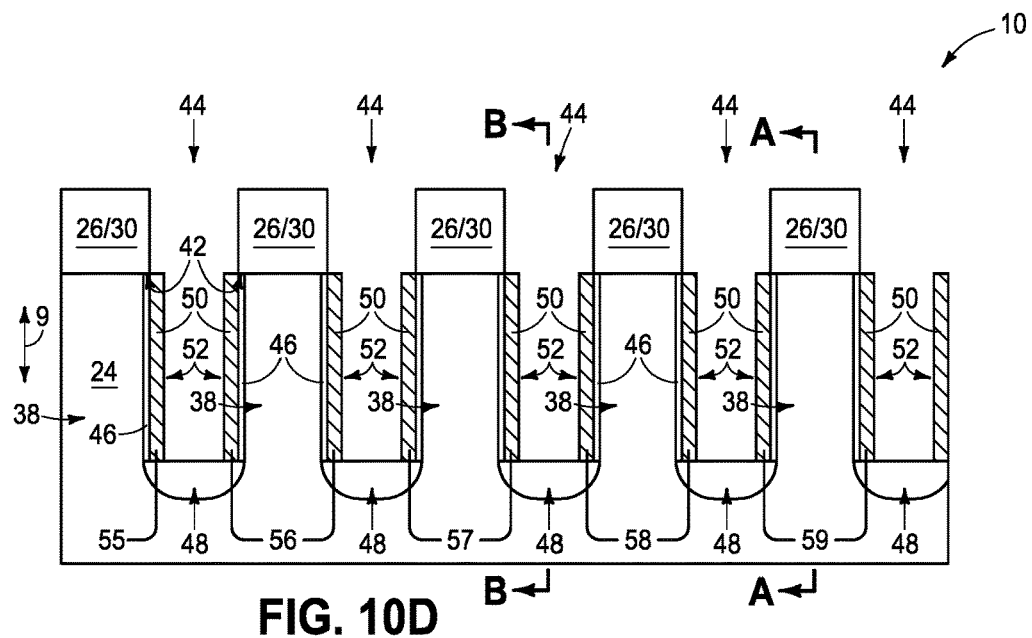

Referring to FIGS. 10-10D, the conductive material 50 and gate dielectric material 46 are etched. Such etching forms the conductive material 50 into linear conductive structures 52. The linear conductive structures 52 extend along the second direction of axis 7, and are spaced from the semiconductor material pillars 36 by the gate dielectric material 46.

In some embodiments, the linear conductive structures 52 may be incorporated into wordlines. For instance, in the shown embodiment the conductive structures are incorporated into wordlines 55-59. Notably, each wordline comprises a pair of the linear conductive structures 52; with the paired linear conductive structures of each wordline including one linear conductive structure on one side of a row of the semiconductor material pillars 36, and another linear conductive structure on an opposing side of the row of the semiconductor material pillars 36. The paired linear conductive structures of each wordline are electrically coupled one another, as will be understood by persons of ordinary skill in the art. Such coupling may occur at any suitable location.

Notably, two separated linear conductive structures 52 are within each of the guide regions 44; with each of the linear conductive structures within a single guide region corresponding to portions of different wordlines. For instance, one of the guide regions is labeled as 44a in FIG. 10C, and such guide region has two linear structures 52 therein; with one of the linear structures corresponding to a portion of the wordline 56, and the other corresponding to a portion of the wordline 57.

The processing described herein advantageously provides substantially vertical sidewalls along the insulative pillars 38 (shown in FIG. 10D), which can enable appropriate spacing between the linear conductive structures 52 to be maintained along the entire span of the guide regions 44. Such may eliminate undesired shorting between adjacent linear structures 52 which may otherwise occur. Also, the processing described herein advantageously forms the overhanging edges 42 of the protective materials 26/30 over the insulative material pillars 38 (shown in FIG. 10D). In some applications, such overhanging regions may define a location for the top surface of the linear conductive structures 52, as shown. Such may enable the linear conductive structures 52 to be readily patterned into configurations suitable for incorporation into transistors (with example transistors being described below with reference to FIGS. 11-11D).

Figure 11:
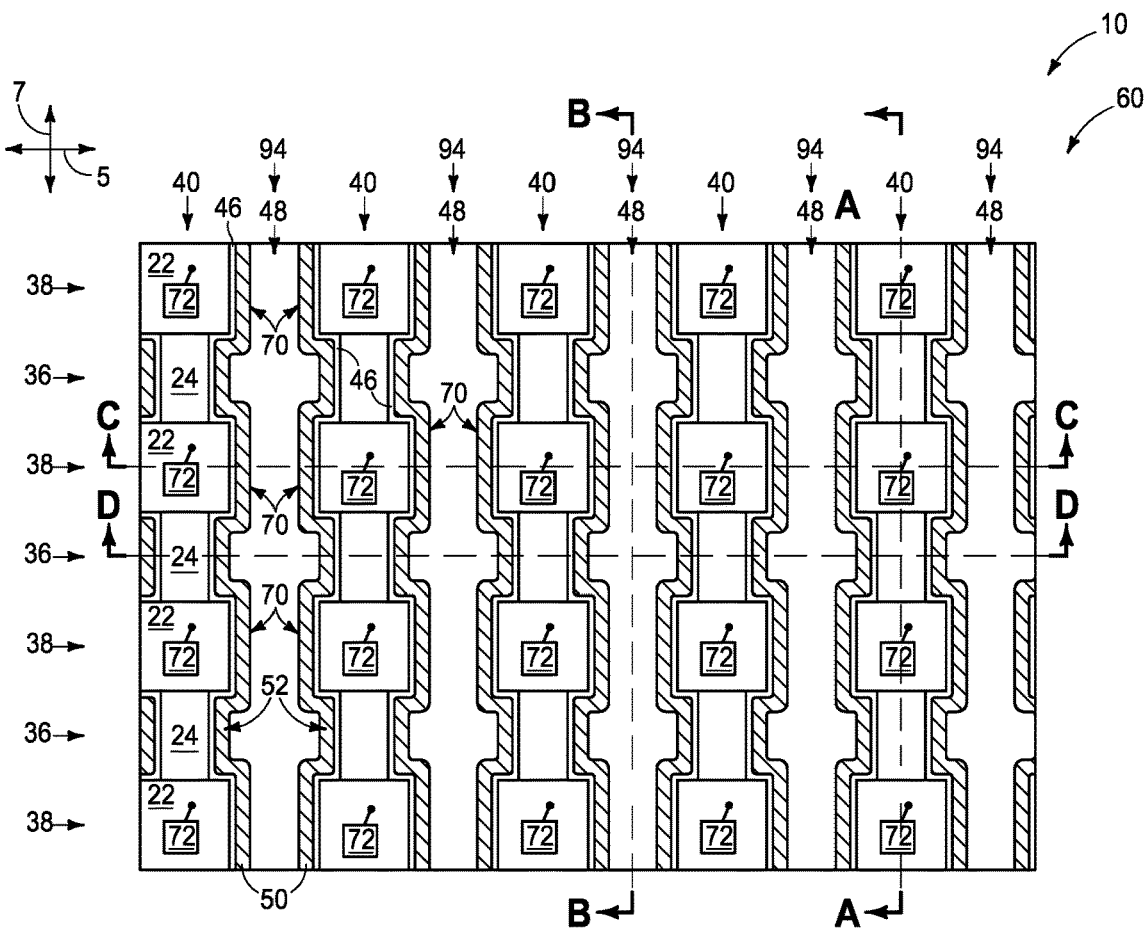
Figure 11A:
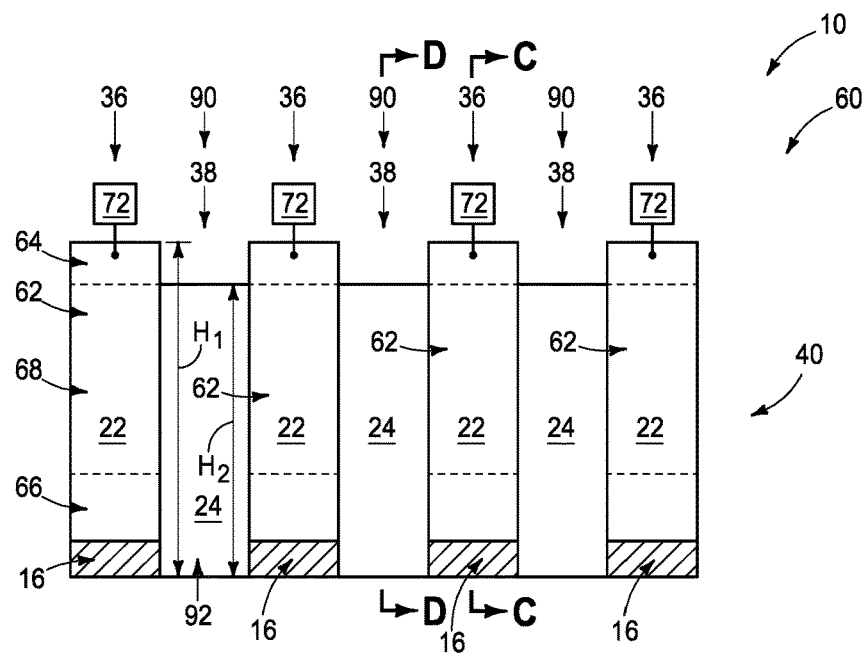
Figure 11B:
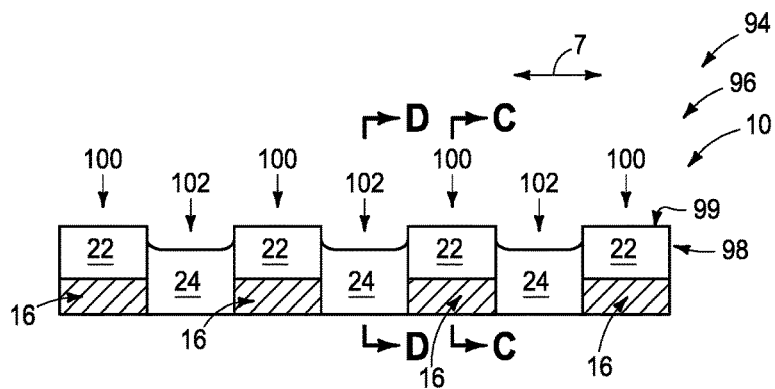
Figure 11C:
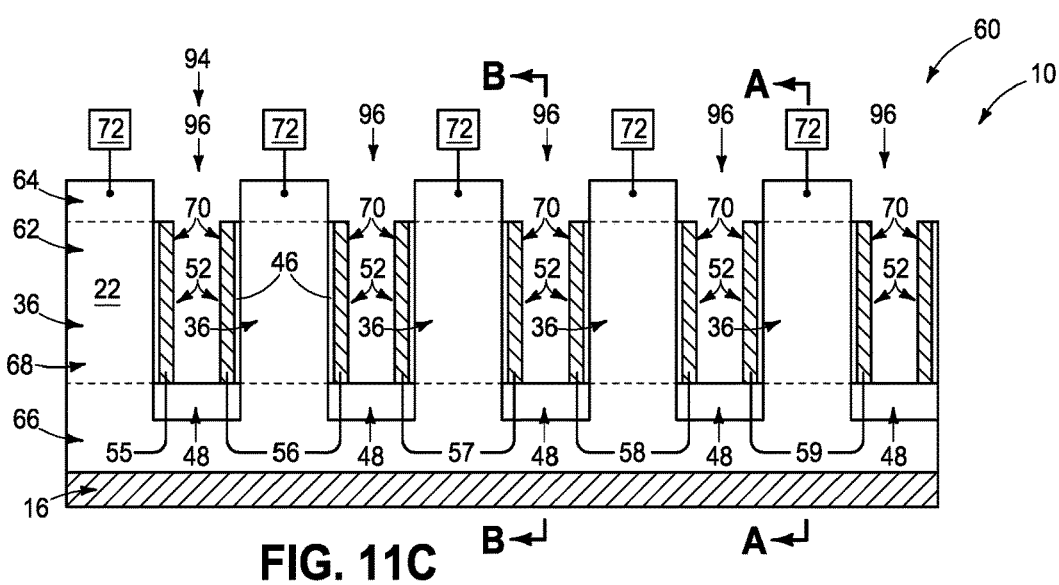
Figure 11D:
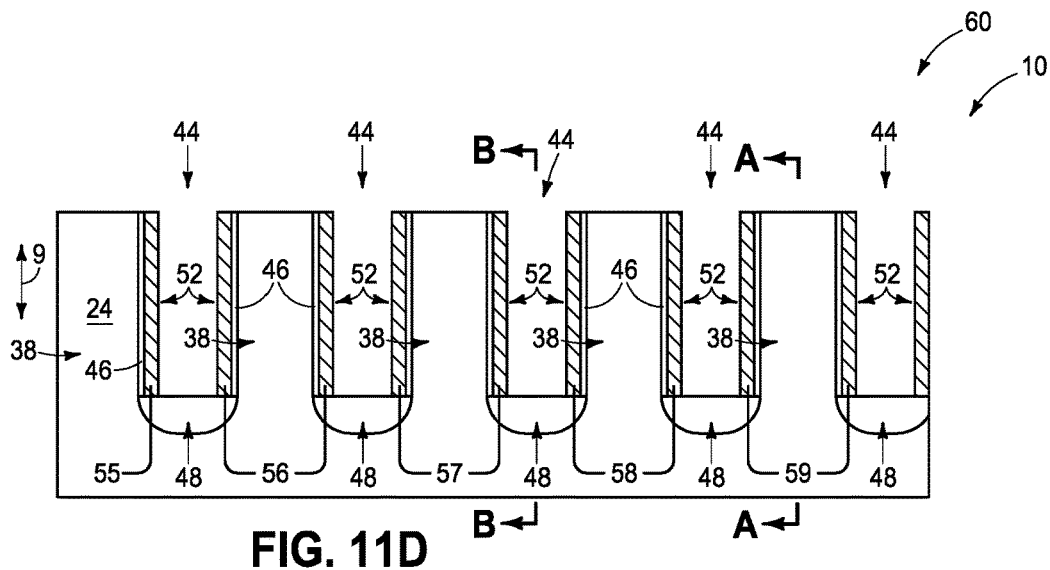

Referring to FIGS. 11-11D, assembly 10 is illustrated in accordance with an application in which the linear conductive structures 52 are incorporated into wordlines 55-59 associated with a memory array 60. The wordlines 55-59 extend along opposing sides of the rows 40 of the semiconductor material pillars 36. The individual pillars 36 are incorporated into transistors 62; with each transistor having an upper source/drain region 64, a lower source/drain region 66, and a channel region 68 between the upper and lower source/drain regions. Approximate lower boundaries of the upper source/drain regions are indicated with dashed lines, and approximate upper boundaries of the lower source/drain regions are also indicated with dashed lines. The source/drain regions 64 and 66 may be doped with any suitable conductivity-enhancing dopant(s), and may be n-type doped or p-type doped. Also, the channel regions 62 may be doped with any suitable dopant to achieve a desired threshold voltage. The dopants may be provided within the source/drain regions 64 and 66, and the channel region 62, at any suitable processing stage. Such process stage may be, for example, prior to the illustrated processing stage of FIG. 1 for at least some of the dopants, and may be subsequent to the process stage of FIG. 10 for others of the dopants.

The bottom source/drain regions 66 are coupled with the digit lines 16.

The transistors 62 are gated by gates 70 corresponding to regions of the wordlines 55-59 which are adjacent the semiconductor material pillars 36, and spaced from such pillars by the gate dielectric material 46.

The protective capping material 26/30 is removed at the processing stage of FIGS. 11-11D. In other embodiments, at least some of the protective capping material may remain after formation of the transistors 62.

Memory cells 72 are coupled with the source/drain regions 64 of the transistors 62. The memory cells 72 may comprise any suitable configurations, and in some embodiments may be capacitors, phase change memory cells, resistive random access memory cells, conductive bridging memory cells, etc.

Figure 12:
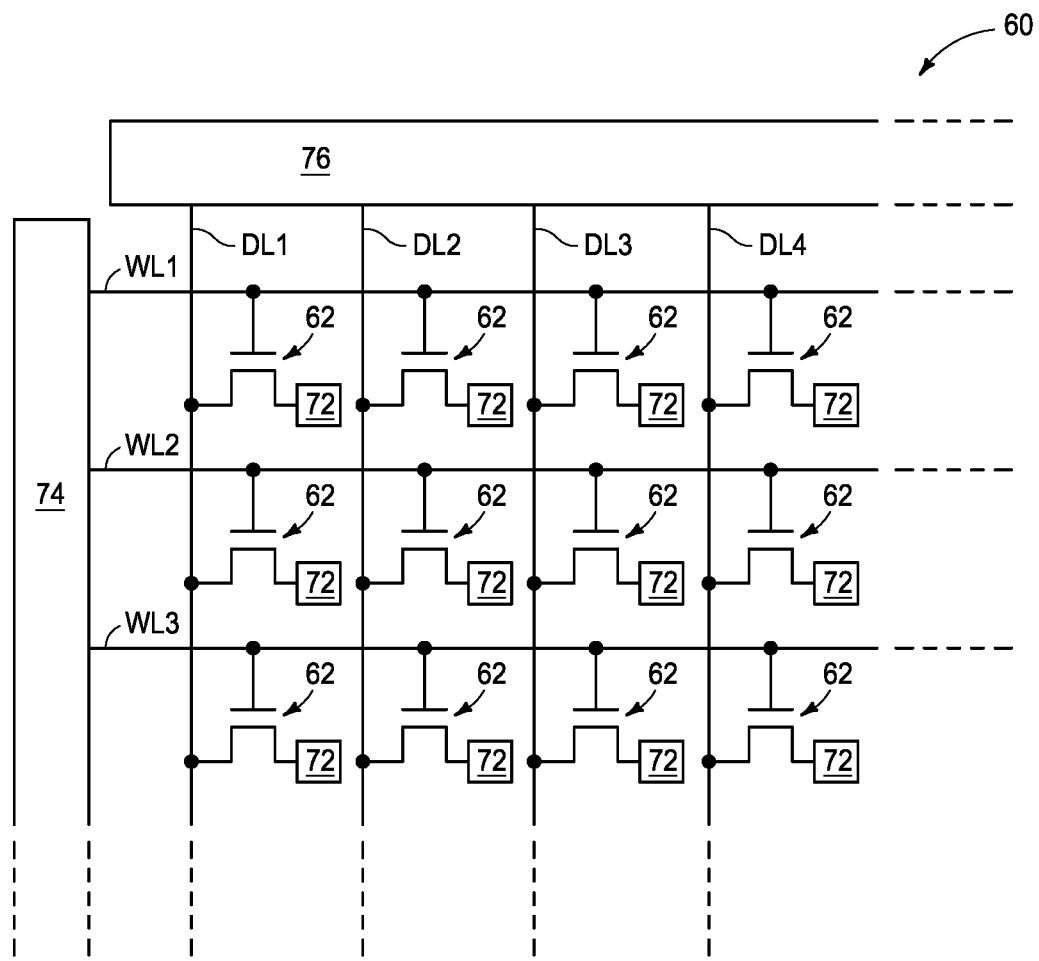
FIG. 12 is a diagrammatic schematic view of an example memory array.

In operation, each of the memory cells 72 may be uniquely addressed by a digit line 16 and one of the wordlines 55-59. For instance, FIG. 12 schematically illustrates an example memory array 60 comprising access transistors 62 in combination with memory cells 72. The memory array also comprises wordlines WL1, WL2 and WL3, and digit lines DL1, DL2, DL3 and DL4. The wordlines may correspond to wordlines of the type shown in FIGS. 11-11D as wordlines 55-59, and the digit lines may correspond to digit lines of the type shown in FIGS. 11-11D as digit lines 16.

The access transistors 62 of FIG. 12 comprise gates coupled with the wordlines, source/drain regions coupled with the digit lines, and other source/drain regions coupled with the memory cells. In operation, each of the memory cells 72 may be uniquely addressed through a combination of one of the wordlines and one of the digit lines.

The wordlines WL1, WL2 and WL3 of FIG. 12 are shown extending to circuitry 74, and the digit lines DL1, DL2, DL3 and DL4 are shown extending to circuitry 76. In some applications, the circuitry 74 may correspond to driver circuitry, and the circuitry 76 may correspond to sensing circuitry.

Although FIGS. 11 and 12 show the transistor constructions incorporated into memory/storage, it is to be understood that the transistor constructions described herein may be alternatively, or additionally, incorporated into logic, sensors, or any other suitable circuitry.

The embodiment of FIGS. 11-11D forms wordlines 55-59 which only wrap partially around the semiconductor material pillars 36. In other embodiments, the wordlines may be formed to wrap entirely around the semiconductor material pillars. An example of such other embodiments is described with reference to FIGS. 13-15.

Figure 13:
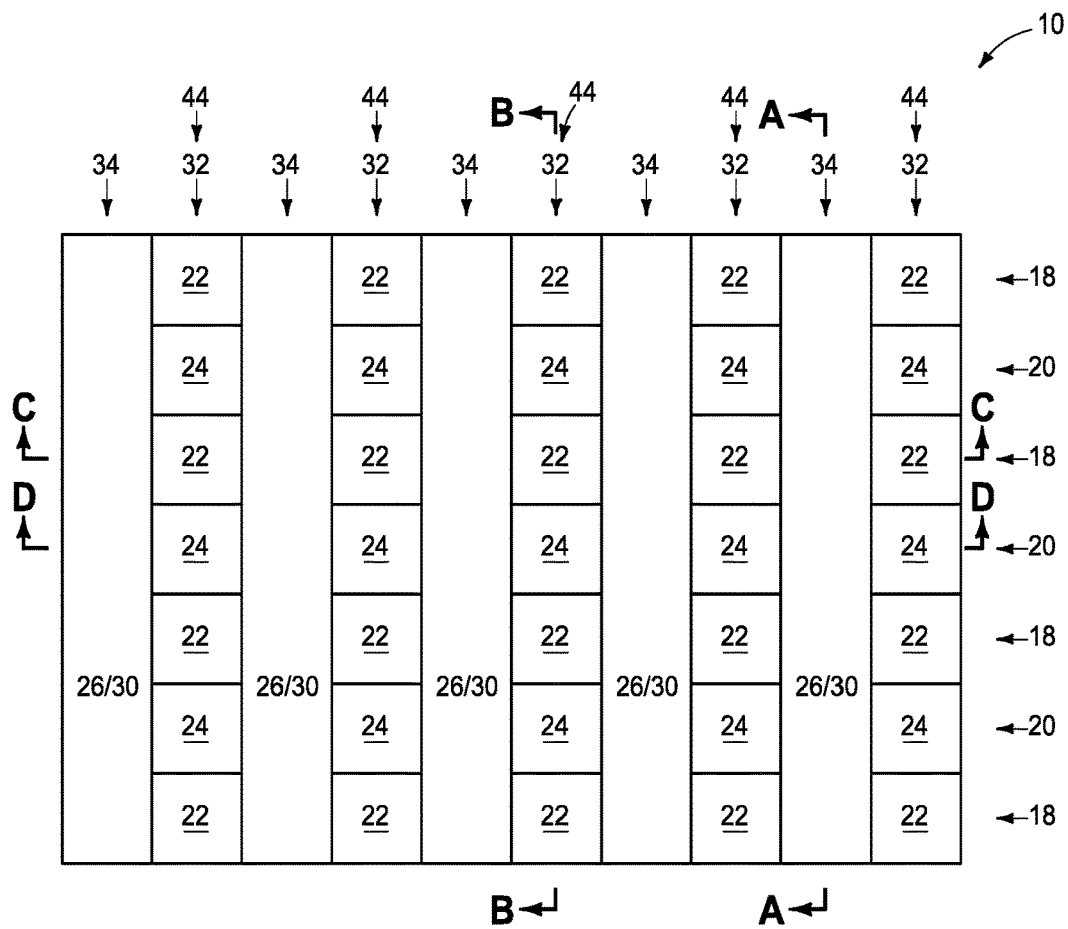
FIGS. 13-16 show example process stages of another example method. The process stage of FIG. 13 may follow that of FIG. 6.
Figure 13A:
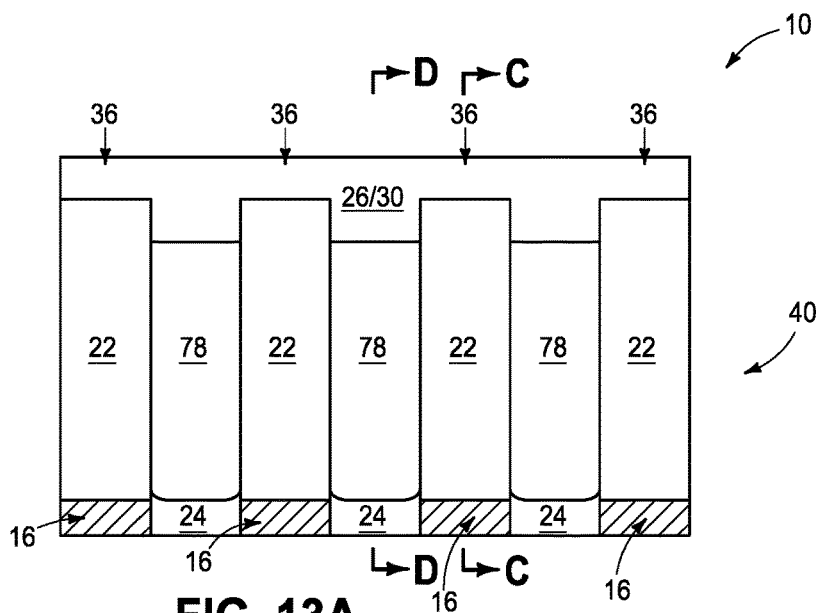
Figure 13B:
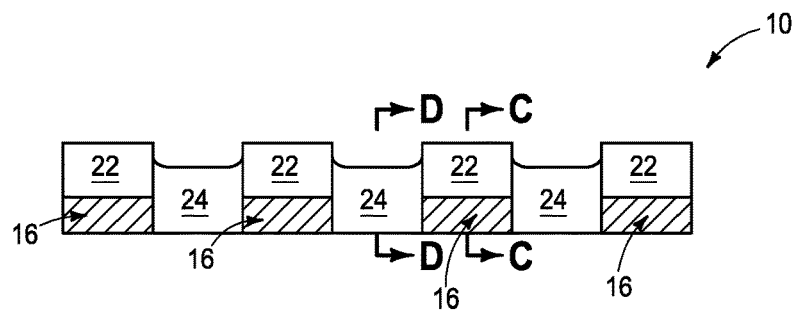
Figure 13C:
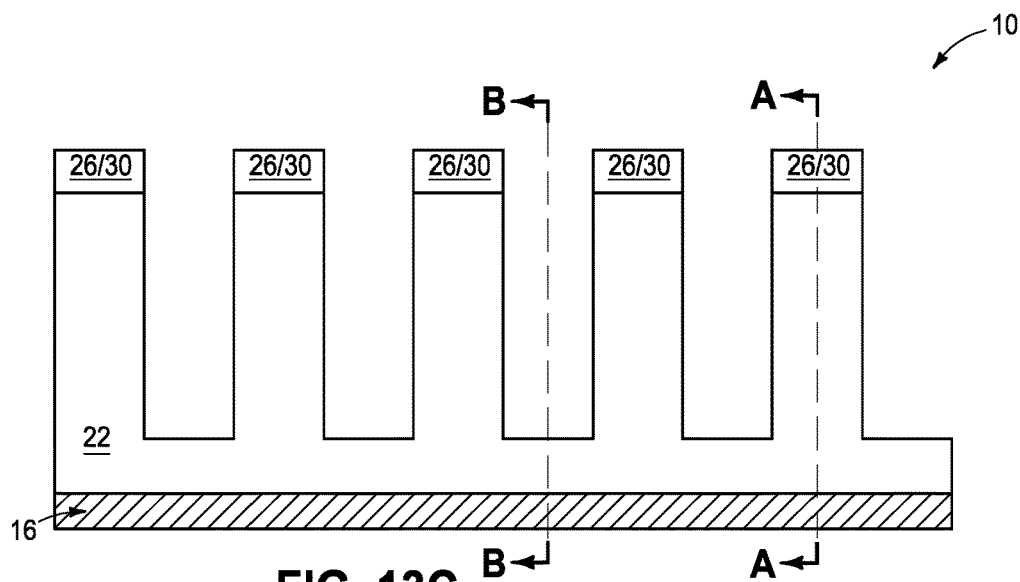
Figure 13D:
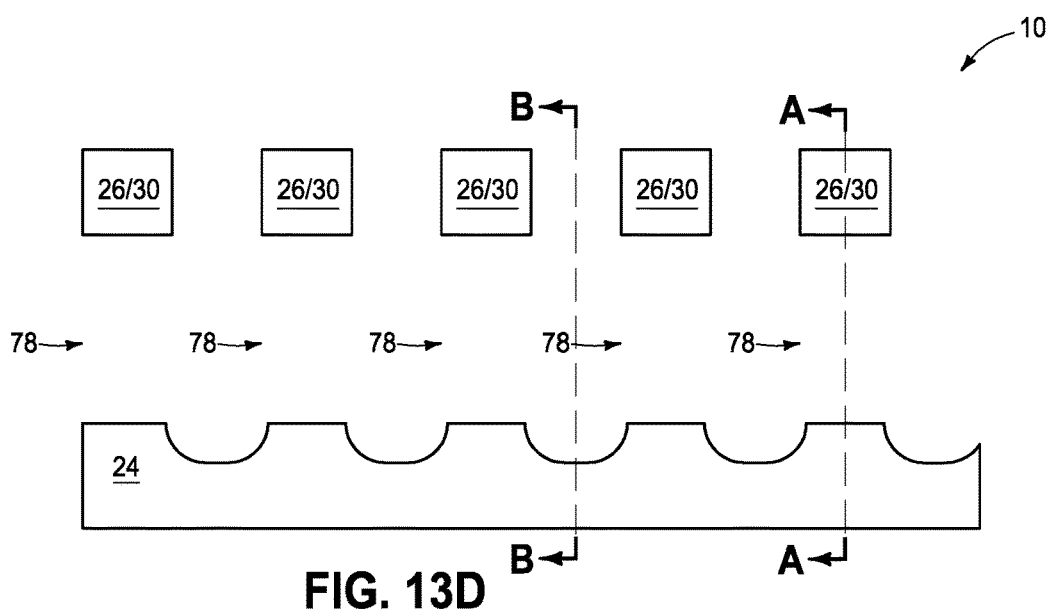

Referring to FIGS. 13-13D, assembly 10 is illustrated at a process stage which may follow that of FIGS. 7-7D, and which may be alternative to that described above with reference to FIGS. 8-8D. The insulative material 24 has been entirely removed from between the semiconductor material pillars 36 along the rows 40, leaving voids (e.g., air gaps) 78 between the pillars 36 along the rows 40 (shown in FIG. 13A).

Figure 14:
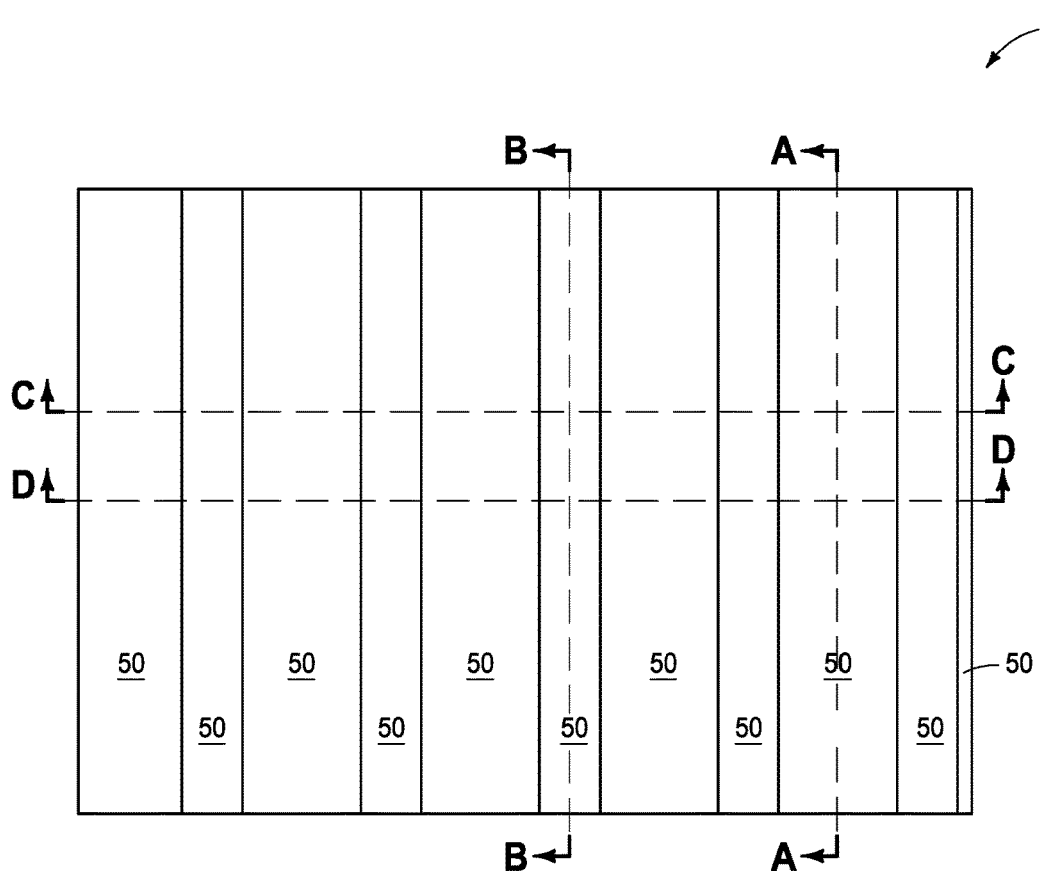
Figure 14A:
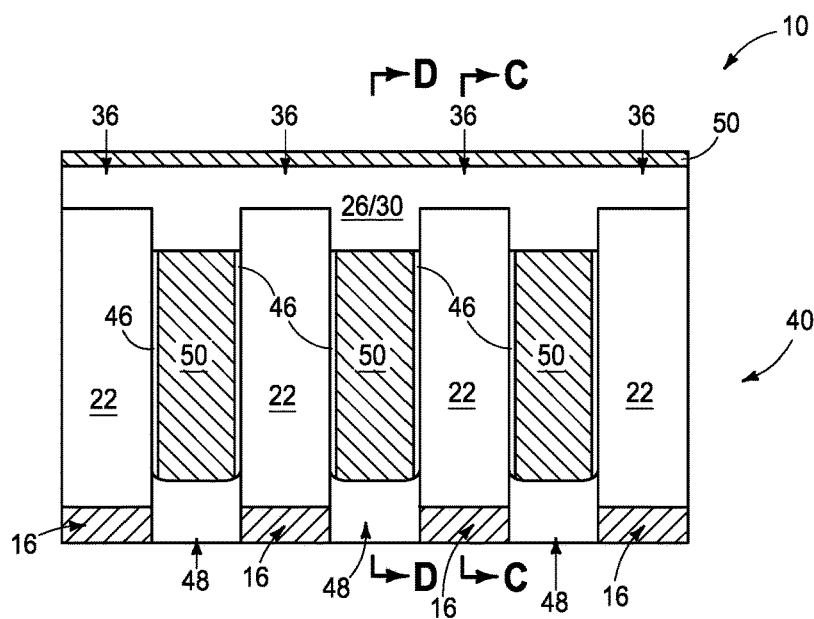
Figure 14B:
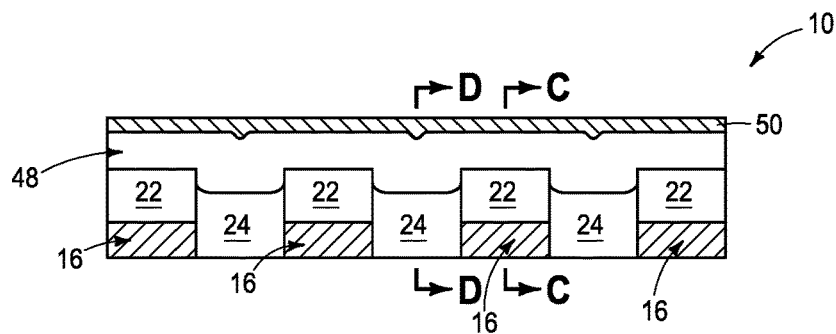
Figure 14C:
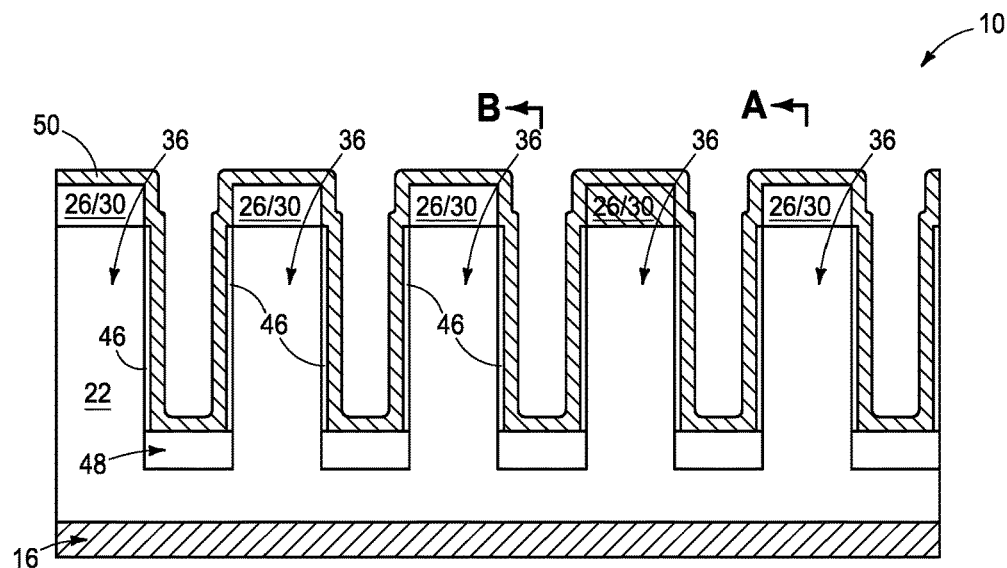
Figure 14D:
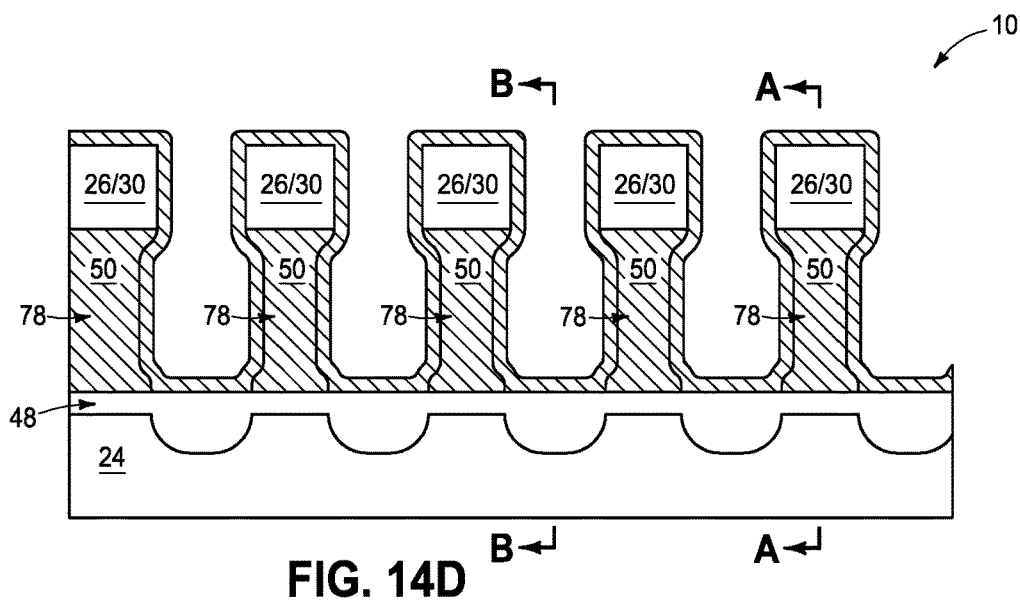

Referring to FIGS. 14-14D, assembly 10 is shown at a process stage following that of FIGS. 13-13D, and alternative to that of FIGS. 9-9D. The insulative material spacers 48 are formed. The gate dielectric material 46 is formed along sidewalls of the semiconductor material pillars 36, and in the embodiment of FIGS. 14-14D is selectively formed on the sidewalls of such pillars. Such selective formation may occur by, for example, oxidation of the pillar sidewalls in applications in which the semiconductor material 22 comprises silicon (or other material which may be oxidized to form suitable gate dielectric material). The conductive material 50 is formed over the gate dielectric material 46, and over the pillars 36. Notably, the conductive material 50 entirely fills the void regions 78, and thus fills spaces between the semiconductor pillars 36 along the rows 40 (as shown in FIG. 14A).

Figure 15:
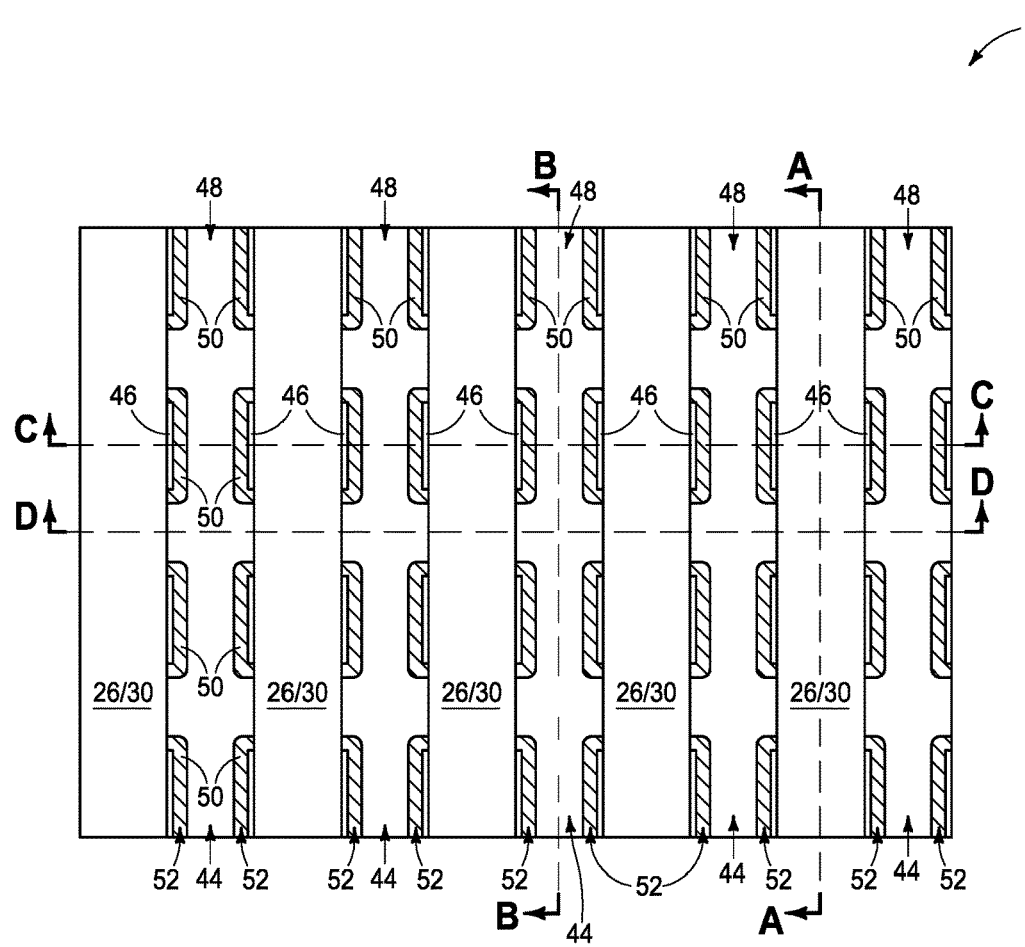
Figure 15A:
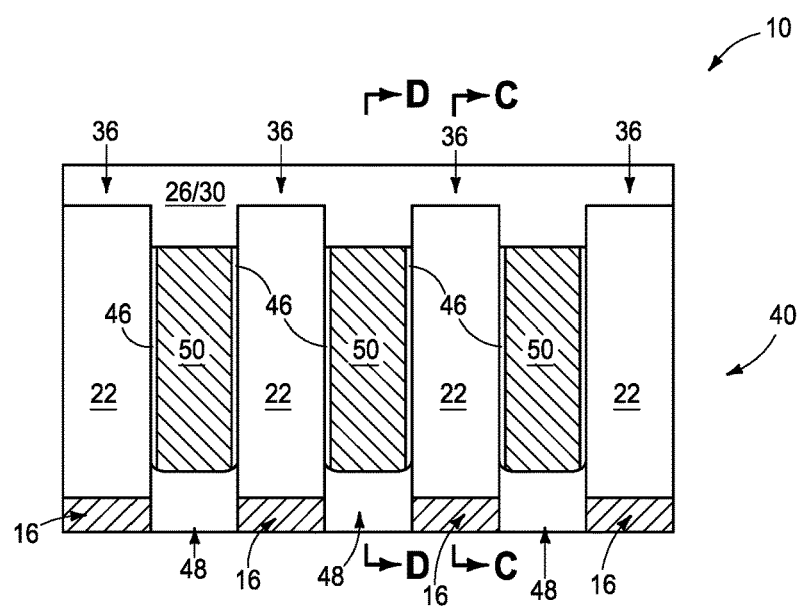
Figure 15B:
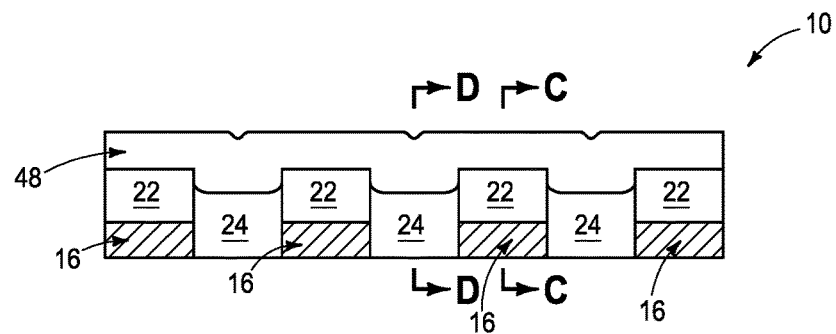
Figure 15C:
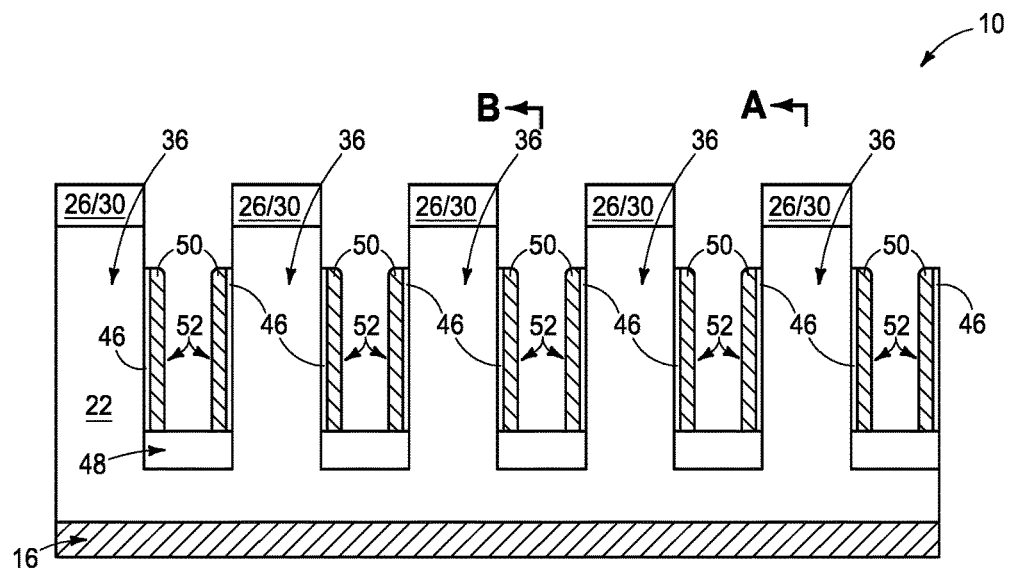
Figure 15D:
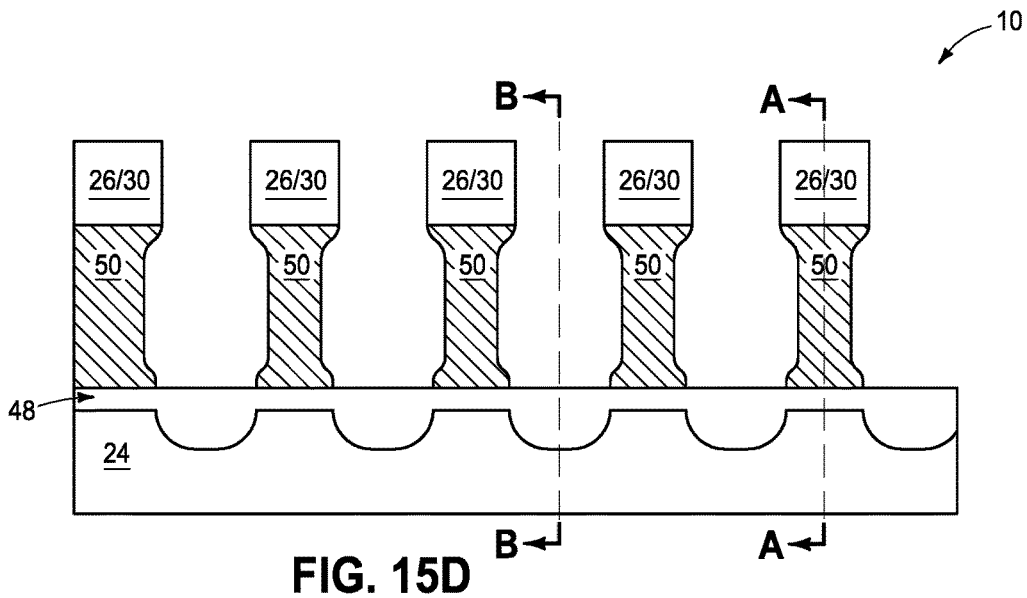

Referring to FIGS. 15-15D, assembly 10 is shown at a process stage following that of FIGS. 14-14D, and alternative to that of FIGS. 10-10D. The conductive material 50 is etched to form the linear conductive structures 52. The gate dielectric material 46 is shown to be removed from along regions of the pillars 36 exposed by the etch of the conductive material 50 (FIG. 15C). In other embodiments, the gate dielectric material may not be removed from along such regions.

Figure 16:
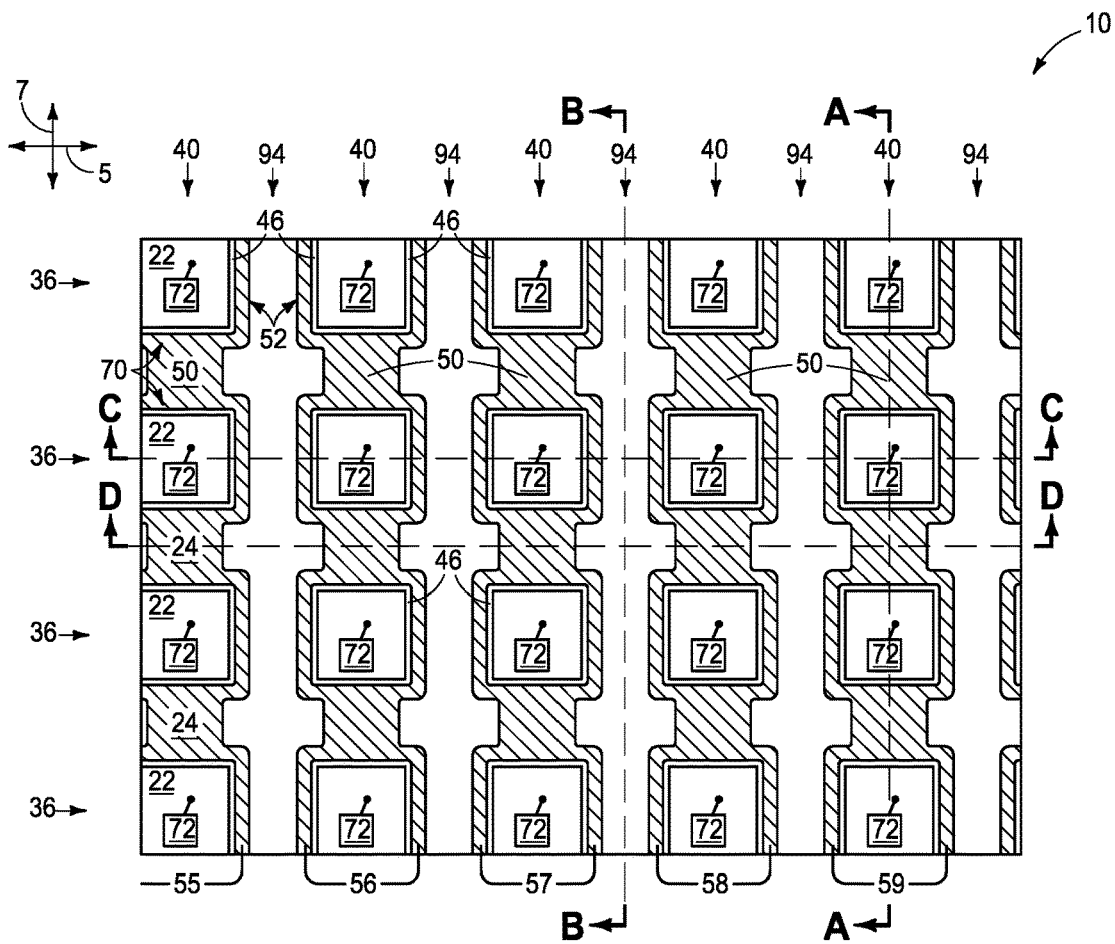
Figure 16A:
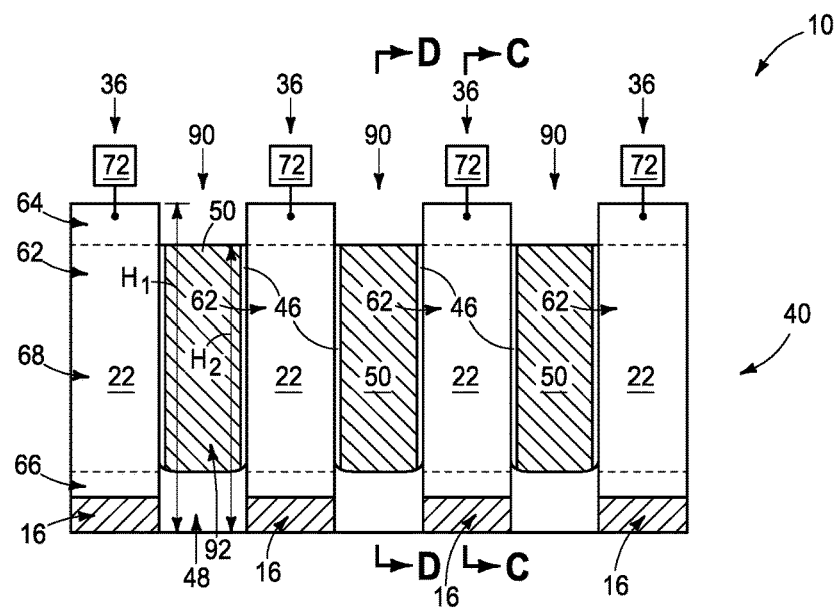
Figure 16B:
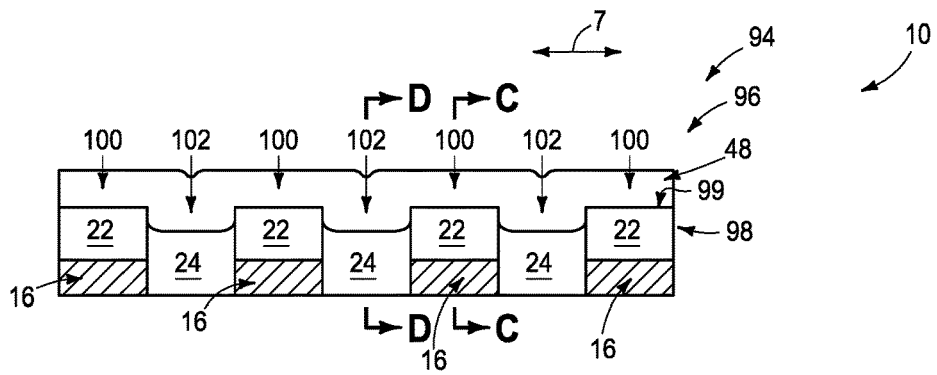
Figure 16C:
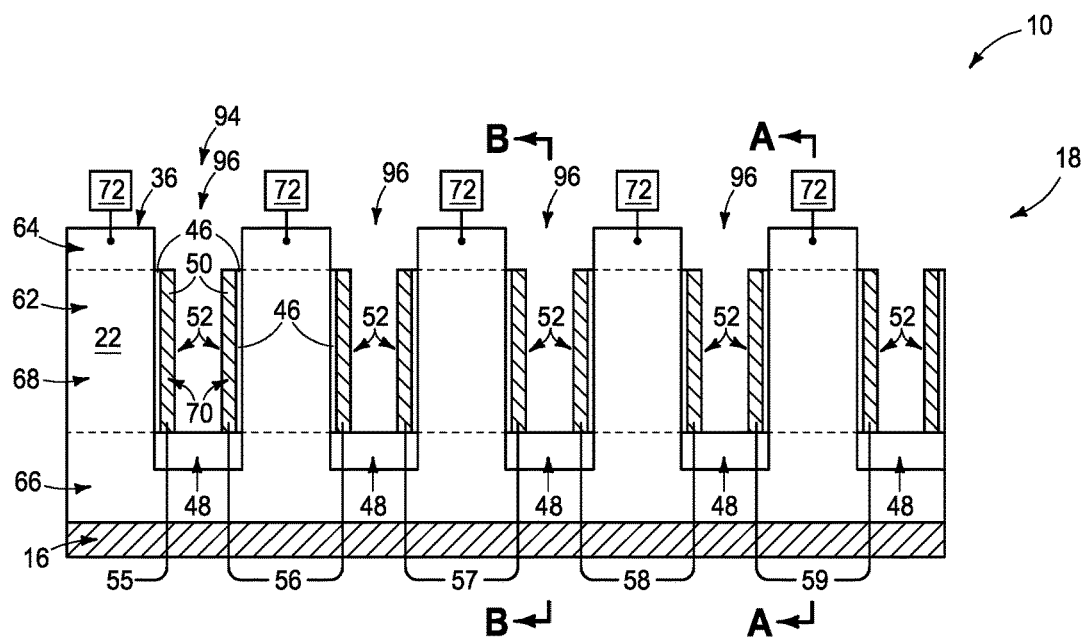
Figure 16D:
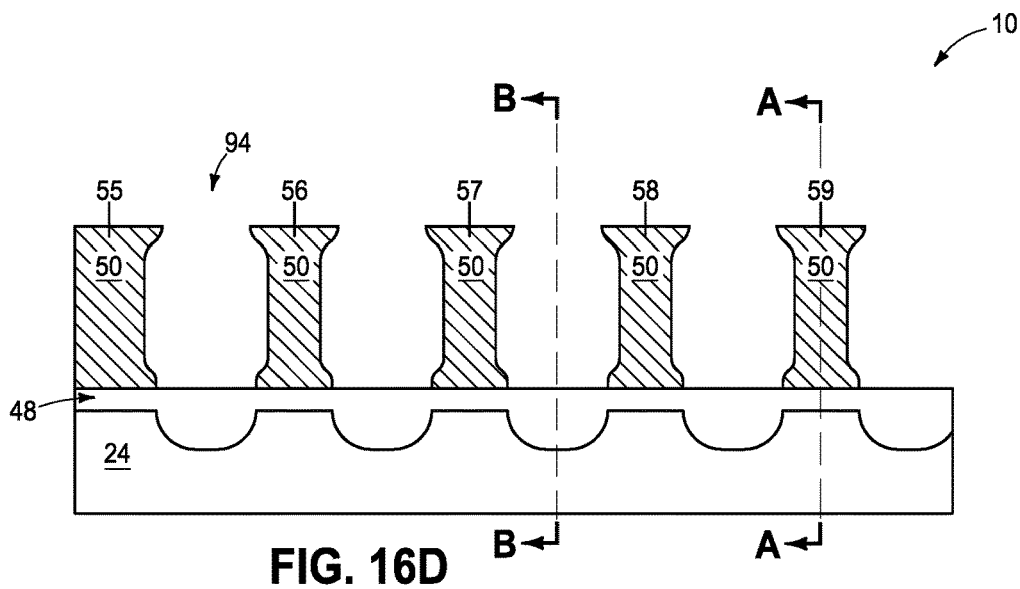

Referring to FIGS. 16-16D, assembly 10 is shown at a process stage following that of FIGS. 15-15D, and alternative to that of FIGS. 11-11D. Advantageously, the linear structures 52 wrap entirely around the second material pillars 36 (as is visible in FIG. 16).

The transistors 62 are formed at the process stage of FIGS. 16-16D, and the wordlines 55-59 extend along the transistors. However, in contrast to the embodiment of FIGS. 11-11D, that of FIGS. 16-16D has the wordlines wrapping entirely around the semiconductor material pillars 36. Accordingly, the transistor gates may wrap entirely around the semiconductor material pillars 36, which may improve coupling between the gates 70 and the channel regions 68.

Figure 17:
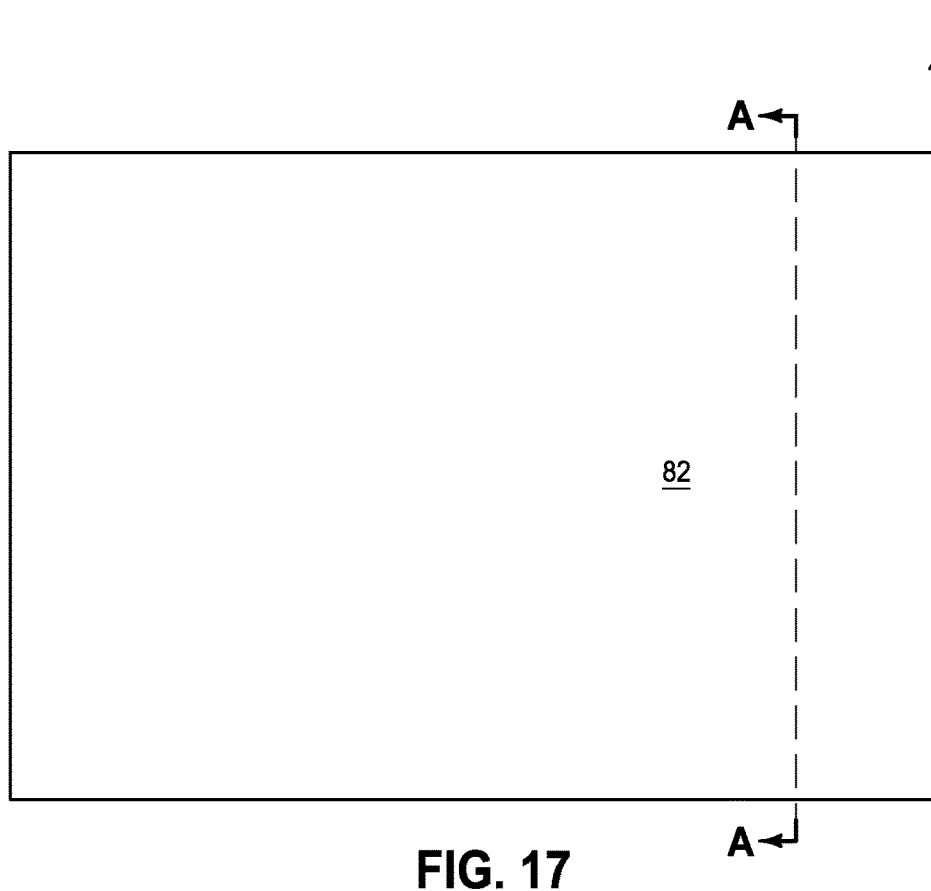
FIGS. 17 and 18 show example process stages of another example method. The process stage of FIG. 17 may follow that of FIG. 3.
Figure 17A:
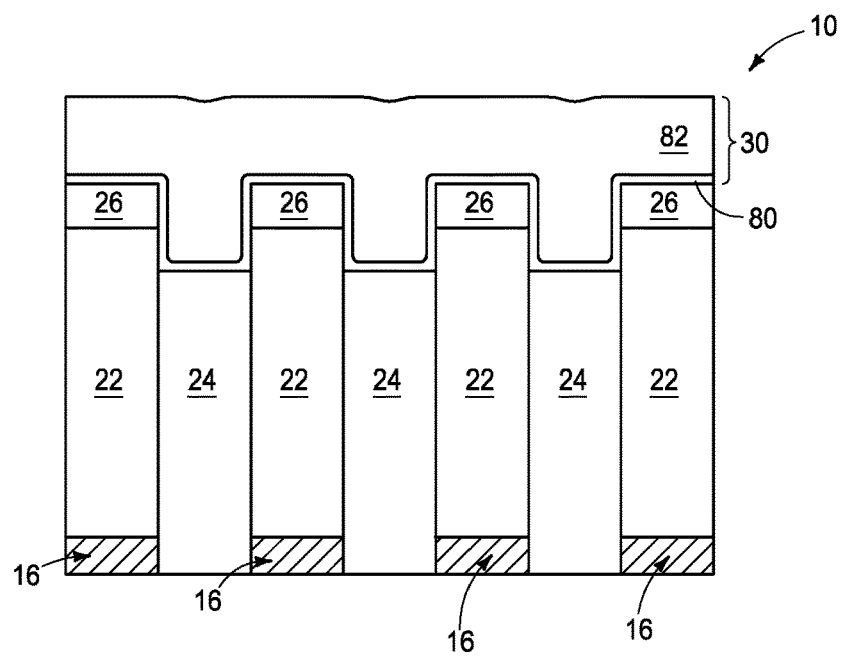
FIGS. 17A and 18A are views along the lines A-A of FIGS. 17 and 18.

As noted above in referring to the processing stage of FIG. 4, the protective capping material 30 may comprise multiple materials in some applications. FIGS. 17 and 17A show assembly 10 at a processing stage analogous to that of FIGS. 4 and 4A, but in which the protective capping material 30 comprises two compositions 80 and 82. In some applications, the composition 80 may be an oxide liner; and may, for example, comprise, consist essentially of, or consist of silicon dioxide. The composition 82 may, for example, comprise, consist essentially of, or consist of silicon nitride. The oxide liner 80 may alleviate undesired stresses which may occur if the nitride-containing composition 82 is directly deposited on some of the underlying materials. Additionally, or alternatively, the oxide liner may be utilized as a barrier to preclude charges from migrating into the silicon nitride composition, and accordingly to alleviate problems that may be associated with charge-trapping characteristics of the nitride-containing composition 82.

Figure 18:
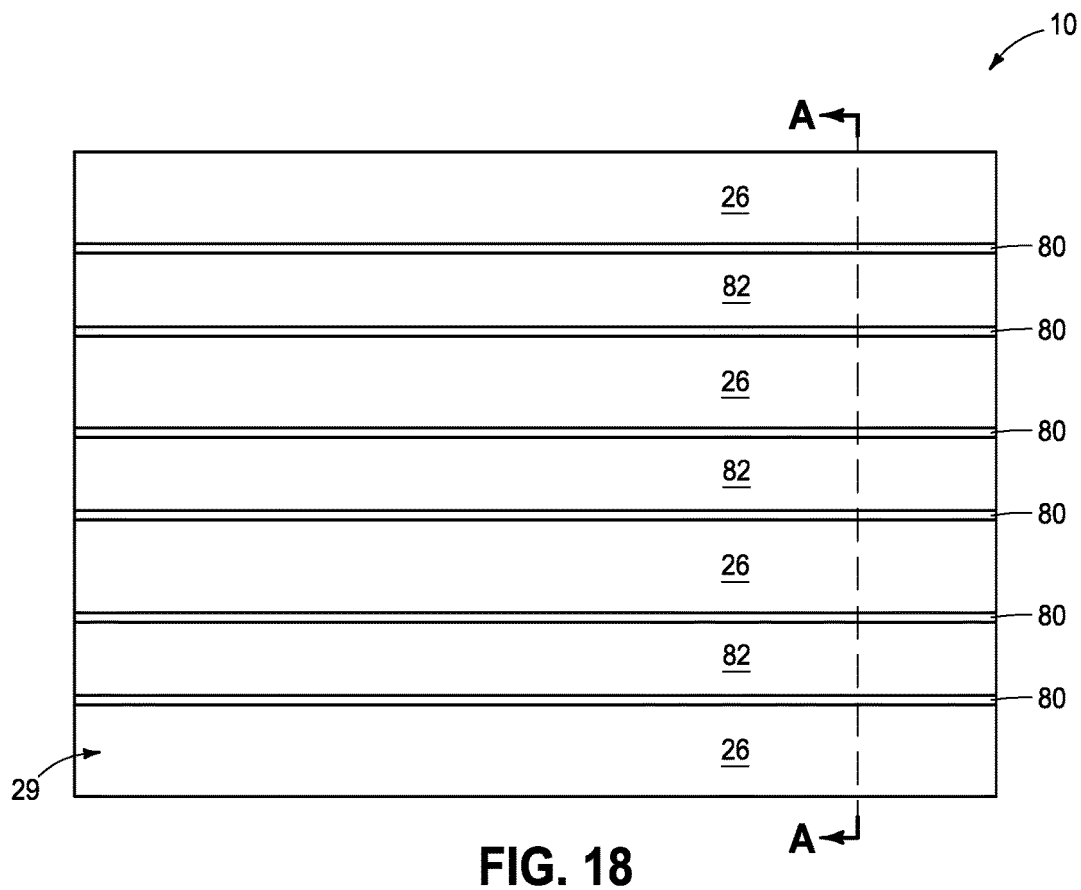
Figure 18A:
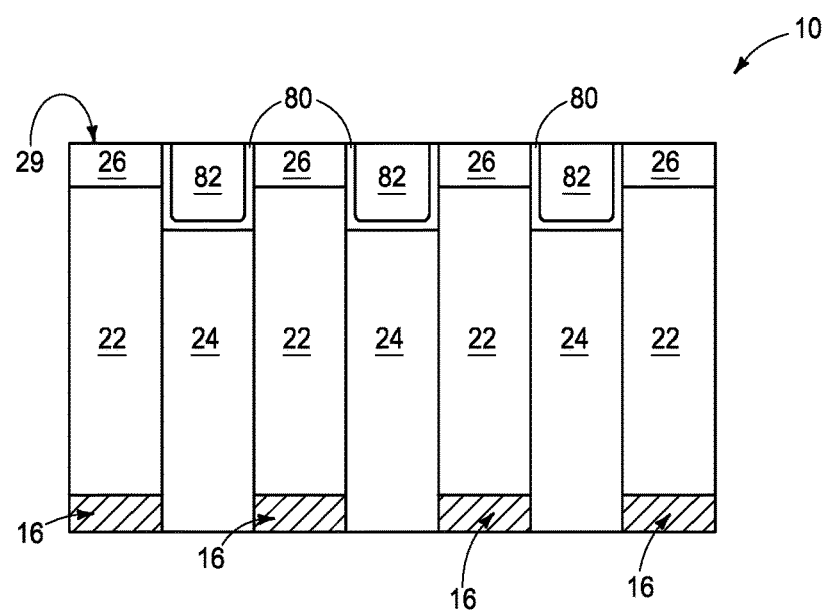

Referring to FIGS. 18 and 18A, construction 10 is shown at a processing stage subsequent to that of FIGS. 17 and 17A, and specifically after planarization (e.g., polishing) to form the planarized upper surface 29. Subsequently, the assembly of FIGS. 18 and 18A may be subjected to processing described above for fabrication of transistors.

Some embodiments include structures of the type described above with reference to FIGS. 11-11D and 16-16D. Such structures may be considered to comprise pillars 36 of semiconductor material 22, with such pillars being arranged in rows 40 extending along the direction of axis 7 (which may be referred to as a first direction in some embodiments). The rows comprise intervening spacing regions 90 between the pillars 36 (with regions 90 being labeled in FIGS. 11A and 16A). The pillars have upper surfaces at first height H1, and the intervening spacing regions comprise spacing structures 92 having upper surfaces at a second height H2, which is less than the first height. The embodiment of FIG. 11A shows spacing structures 92 which are insulative, and the embodiment of FIG. 16A shows spacing structures 92 which are conductive.

The rows 40 are spaced from one another by gap regions 94 (FIGS. 11 and 16), and the linear conductive structures 52 are between the rows 40 and extend along the first direction of axis 7 within the gap regions. Two of the linear structures 52 are within each of the gap regions 94, and are spaced from one another by a separating region 96 (shown in FIGS. 11B, 11C, 16B and 16C). The separating region 96 has a floor section 98 (shown in FIGS. 11B and 16B), with such floor section having an undulating surface 99 that extends across semiconductor segments 100 and insulative segments 102. The semiconductor segments 100 are higher than the insulative segments 102 due to the insulative material 24 having been recessed at the processing stage of FIGS. 8-8D. The semiconductor segments 100 may be higher than the insulative segments 102 by any suitable amount, and in some embodiments may be at least about 5 Å higher, at least about 10 Å higher, at least about 5 nm higher, etc. The floor section may be covered by other materials in a final construction, and FIG. 16B shows the spacing material 48 over the floor section.

The embodiments of FIGS. 11B and 16B show the semiconductor segments 100 and insulative segments 102 alternating with one another along the direction of axis 7 (with the axis 7 being shown relative to the top views of FIGS. 11 and 16; and being shown in FIGS. 11B and 16B). In some embodiments, the directions of axes 5 and 7 may be referred to as first and second directions, respectively; and in other embodiments the directions of axes 5 and 7 may be instead referred to as second and first directions, respectively.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method for fabricating integrated circuitry. An assembly is formed to comprise first rails alternating with second rails. The first rails comprise semiconductor material, and the second rails comprise insulative material. The first and second rails extend along a first direction. The first rails are capped with a first protective capping material. The second rails are recessed relative to the first rails, with the second rails being recessed to a depth below bottom surfaces of the first protective capping material. Second protective capping material is formed over the recessed second rails. Trenches are formed which extend along a second direction. The second direction crosses the first direction. The trenches extend through the first and second protective capping materials, and into the first and second rails. The trenches are spaced from one another by intervening linear structures comprising alternating first and second pillars. The first pillars comprise the semiconductor material, and the second pillars comprise the insulative material. the first pillars within each of the intervening linear structures are configured as a row of the first pillars. Sidewalls of the second pillars are recessed relative to sidewalls of the first pillars. The recessing converts the trenches into linear guides which extend along the second direction and which have sidewall regions comprising the rows of the first pillars. the linear guides have sidewall segments along the sidewall regions, with the sidewall segments comprising sidewalls of the first pillars. After said recessing of the sidewalls of the second pillars, gate dielectric material is formed along the sidewall segments of the linear guides, and linear conductive structures are formed within the linear guides and along the gate dielectric material. the linear conductive structures extend along the second direction.

Some embodiments include a method for fabricating integrated circuitry. An assembly is formed to comprise first rails alternating with second rails. The first rails comprise semiconductor material, and the second rails comprise insulative material. The first and second rails extend along a first direction. The first rails are capped with a first protective capping material. The second rails are recessed relative to the first rails to form first trenches extending along the first direction, with the second rails being recessed to a depth below bottom surfaces of the first protective capping material. Second protective capping material is formed within the first trenches and over the first protective capping material. A planarization process is used to remove the second protective capping material from over the first protective capping material while leaving the second protective capping material within the first trenches. Second trenches are formed to extend along a second direction, with the second direction crossing the first direction. The second trenches extend through the first and second protective capping materials, and into the first and second rails. The second trenches are spaced from one another by intervening regions comprising alternating first and second pillars. The first pillars comprise the semiconductor material, and the second pillars comprise the insulative material. Sidewalls of the second pillars are recessed relative to sidewalls of the first pillars. After said recessing of the sidewalls of the second pillars, gate dielectric material is formed along the first pillars, and linear conductive structures are formed along the gate dielectric material. The linear conductive structures extend along the second direction.

Some embodiments include an assembly which includes pillars of semiconductor material. The pillars are arranged in rows extending along a first direction. The rows comprise intervening spacing regions between the pillars of semiconductor material. The pillars of semiconductor material have upper surfaces at a first height, and the intervening spacing regions have spacing structures with upper surfaces at a second height below the first height. The rows are spaced from one another by gap regions. Linear conductive structures are within the gap regions between the rows and extend along the first direction. Two of the linear conductive structures are within each of the gap regions and are spaced apart from one another by a separating region. The separating region has a floor section with an undulating surface that extends across semiconductor segments and insulative segments. The semiconductor segments are higher than the insulative segments. Transistors comprise channel regions within the pillars of semiconductor material, and comprise gates within the conductive structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method for fabricating an integrated circuitry, comprising:
    forming an assembly comprising first rails alternating with second rails; the first rails comprising a semiconductor material, and the second rails comprising an insulative material; the first rails and the second rails extending along a first direction; the first rails being capped with a first protective capping material;
    recessing the second rails relative to the first rails; the second rails being recessed to a depth below bottom surfaces of the first protective capping material;
    forming a second protective capping material over the recessed second rails;
    forming trenches which extend along a second direction; the second direction crossing the first direction; the trenches extending through the first protective capping material and the second protective capping material, and into the first rails and the second rails; the trenches being spaced from one another by intervening linear structures, wherein the intervening linear structures comprise first pillars alternating with second pillars; the first pillars comprising the semiconductor material, and the second pillars comprising the insulative material; the first pillars within each of the intervening linear structures being configured as a row of the first pillars;
    recessing sidewalls of the second pillars relative to sidewalls of the first pillars; the recessing converting the trenches into linear guides which extend along the second direction and which have sidewall regions comprising the rows of the first pillars; the linear guides having sidewall segments along the sidewall regions, with the sidewall segments comprising the sidewalls of the first pillars; and after said recessing of the sidewalls of the second pillars, forming gate dielectric material along the sidewall segments of the linear guides, and forming linear conductive structures within the linear guides and along the gate dielectric material; the linear conductive structures extending along the second direction.

2. The method of claim 1, wherein the recessing of the sidewalls of the second pillars removes the second pillars from between the first pillars, and wherein the linear conductive structures wrap entirely around the first pillars.

3. The method of claim 1, wherein the recessing of the sidewalls of the second pillars leaves region of the second pillars between the first pillars, and wherein the linear conductive structures do not wrap entirely around the first pillars.

4. The method of claim 1, wherein the first protective capping material and the second protective capping material are a same composition as one another.

5. The method of claim 4, wherein the first protective capping material and the second protective capping material each comprise silicon nitride.

6. The method of claim 5, wherein the insulative material comprises silicon dioxide.

7. The method of claim 1, wherein the second protective capping material is a different composition relative to the first protective capping material.

8. The method of claim 1, wherein the second protective capping material comprises carbon-doped silicon dioxide.

9. The method of claim 1, wherein the trenches formed to extend along the second direction are second trenches; wherein the recessing of the second rails forms first trenches extending along the first direction; and wherein the forming of the second protective capping material comprises forming an oxide liner within the first trenches and then filling the first trenches with silicon nitride.

10. The method of claim 1, wherein two of the linear conductive structures are formed within each of the linear guides, with the two of the linear conductive structures within each of the linear guides being spaced apart from one another.

11. The method of claim 10, wherein the linear conductive structures are comprised by wordlines; wherein the two of the linear conductive structures formed within each of the linear guides are comprised by different wordlines relative to one another; and wherein the linear conductive structures on opposing sides of a same row of the first pillars are part of a common wordline.

12. The method of claim 1, wherein the semiconductor material comprises silicon.

13. The method of claim 1, wherein transistors are formed to include regions of the linear conductive structures adjacent the first pillars and regions of the semiconductor material within the first pillars.

14. The method of claim 1, wherein the linear conductive structures are comprised by wordlines; wherein transistors are formed to include regions of the wordlines adjacent the first pillars and regions of the semiconductor material within the first pillars; and further comprising forming memory cells coupled with the transistors.

15. A method for fabricating an integrated circuitry, comprising:

forming an assembly comprising first rails alternating with second rails; the first rails comprising a semiconductor material, and the second rails comprising an insulative material; the first rails and the second rails extending along a first direction; the first rails being capped with a first protective capping material;

recessing the second rails relative to the first rails to form first trenches extending along the first direction; the second rails being recessed to a depth below bottom surfaces of the first protective capping material;

forming a second protective capping material within the first trenches and over the first protective capping material;

utilizing a planarization process to remove the second protective capping material from over the first protective capping material while leaving the second protective capping material within the first trenches;

forming second trenches which extend along a second direction; the second direction crossing the first direction; the second trenches extending through the first protective capping material and the second protective capping material, and into the first rails and the second rails; the second trenches being spaced from one another by intervening regions, wherein the intervening linear regions comprise first pillars alternating with second pillars; the first pillars comprising the semiconductor material, and the second pillars comprising the insulative material;

recessing sidewalls of the second pillars relative to sidewalls of the first pillars; and after said recessing of the sidewalls of the second pillars, forming gate dielectric material along the first pillars, and forming linear conductive structures along the gate dielectric material; the linear conductive structures extending along the second direction.

16. The method of claim 15, wherein the recessing of the sidewalls of the second pillars removes the second pillars from between the first pillars, and wherein the linear conductive structures wrap entirely around the first pillars.

17. The method of claim 15, wherein the recessing of the sidewalls of the second pillars leaves region of the second pillars between the first pillars, and wherein the linear conductive structures do not wrap entirely around the first pillars.

18. The method of claim 15, wherein the first protective capping material and the second protective capping material are a same composition as one another.

19. The method of claim 15, wherein the first protective capping material and the second protective capping material each comprise silicon nitride.

20. The method of claim 15, wherein transistors are formed to include regions of the linear conductive structures adjacent the first pillars and regions of the semiconductor material within the first pillars.

21. The method of claim 15, wherein the linear conductive structures are comprised by wordlines; wherein transistors are formed to include regions of the wordlines adjacent the first pillars and regions of the semiconductor material within the first pillars; and further comprising forming memory cells coupled with the transistors.

* * * * *